(12) United States Patent
Adachi et al.

(10) Patent No.: US 12,522,013 B2
(45) Date of Patent: Jan. 13, 2026

(54) THREE-DIMENSIONAL DISPLAY, AUTHENTICATION MEDIUM, AND FORMATION METHOD

(71) Applicant: TOPPAN INC., Tokyo (JP)

(72) Inventors: Takehiro Adachi, Tokyo (JP); Soko Koda, Tokyo (JP)

(73) Assignee: TOPPAN INC., Tokyo (JP)

( * ) Notice: Subject to any disclaimer, the term of this patent is extended or adjusted under 35 U.S.C. 154(b) by 41 days.

(21) Appl. No.: 18/532,534

(22) Filed: Dec. 7, 2023

(65) Prior Publication Data

US 2024/0100874 A1  Mar. 28, 2024

Related U.S. Application Data

(63) Continuation of application No. PCT/JP2022/022990, filed on Jun. 7, 2022.

(30) Foreign Application Priority Data

Jun. 9, 2021 (JP) .................................. 2021-096554

(51) Int. Cl.
*B42D 25/328* (2014.01)
*B42D 25/23* (2014.01)
(Continued)

(52) U.S. Cl.
CPC ........... *B42D 25/328* (2014.10); *B42D 25/23* (2014.10); *B42D 25/378* (2014.10);
(Continued)

(58) Field of Classification Search
CPC .... B42D 25/328; B42D 25/23; B42D 25/378; B42D 25/405; B42D 25/45; B42D 25/48
(Continued)

(56) References Cited

U.S. PATENT DOCUMENTS

2006/0262411 A1* 11/2006 Dunn .................... G02B 30/27
 359/619
2009/0162756 A1 6/2009 Staub et al.
2021/0150296 A1* 5/2021 Kagotani ......... G06K 19/06065

FOREIGN PATENT DOCUMENTS

DE  10 2006 016 139 A1  10/2007
EP  3 815 920 A1  5/2021
(Continued)

OTHER PUBLICATIONS

European Extended Search Report issued in corresponding European Patent Application No. 22820226.3 dated Jun. 19, 2024 (8 pages).
(Continued)

*Primary Examiner* — Justin V Lewis
(74) *Attorney, Agent, or Firm* — Foley & Lardner LLP

(57) ABSTRACT

A three-dimensional display including a laminate sheet with first element cells with recorded personal identification information, and second element cells carrying an authentication medium with visible personal identification information, including a first region and a second region formed by arranging first element cells and second element cells which form respective phase shift structures; the first element cells and the second element cells arranged in an interleaved manner at a predetermined ratio to form respective three-dimensional structures; the first region and the second region are visible respectively from first and second sides of the laminate sheet; a first reconstructed image is produced on the first side of the laminate sheet due to the phase shift structure formed by the first element cells; and a second reconstructed image is produced on the second side of the laminate sheet due to the phase shift structure formed by the second element cells.

19 Claims, 15 Drawing Sheets

(51) Int. Cl.
*B42D 25/378* (2014.01)
*B42D 25/405* (2014.01)
*B42D 25/45* (2014.01)
*B42D 25/48* (2014.01)

(52) U.S. Cl.
CPC ............ *B42D 25/405* (2014.10); *B42D 25/45* (2014.10); *B42D 25/48* (2014.10)

(58) Field of Classification Search
USPC ....... 283/67, 70, 72, 81, 87, 91, 94, 98, 901
See application file for complete search history.

(56) References Cited

FOREIGN PATENT DOCUMENTS

| | | |
|---|---|---|
| JP | H04-332686 A | 11/1992 |
| JP | H06-67592 A | 3/1994 |
| JP | 3198324 B2 | 8/2001 |
| JP | 4677683 B2 | 4/2011 |
| JP | 2011-248279 A | 12/2011 |
| JP | 2021-157079 A | 10/2021 |
| WO | WO-2014/118569 A1 | 8/2014 |
| WO | WO-2017/018718 A1 | 2/2017 |
| WO | WO-2017/209113 A1 | 12/2017 |
| WO | WO-2020/004633 A1 | 1/2020 |

OTHER PUBLICATIONS

International Searching Authority, "International Search Report," issued in connection with International Patent Application No. PCT/JP2022/022990, dated Sep. 6, 2022.

International Searching Authority, "Written Opinion," issued in connection with International Patent Application No. PCT/JP2022/022990, dated Sep. 6, 2022.

\* cited by examiner

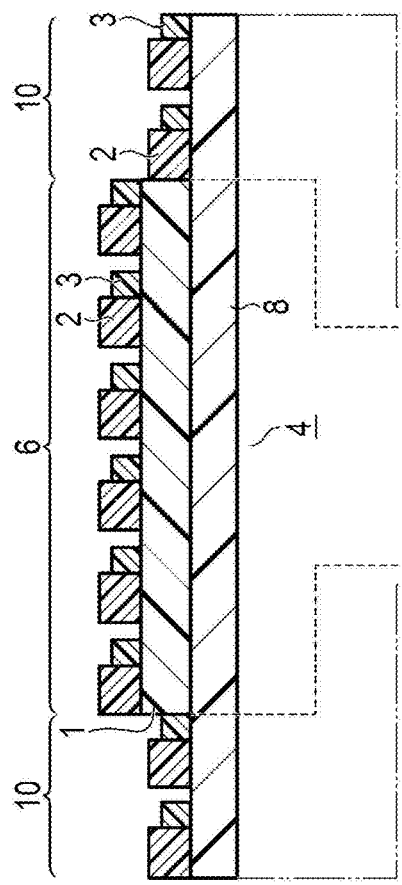
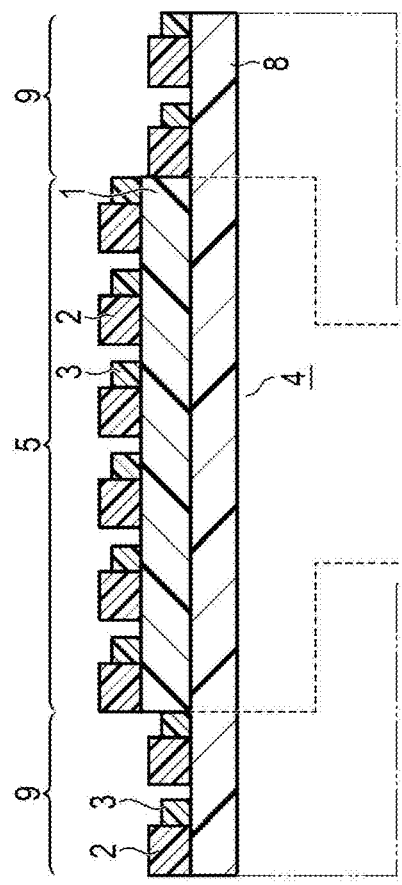
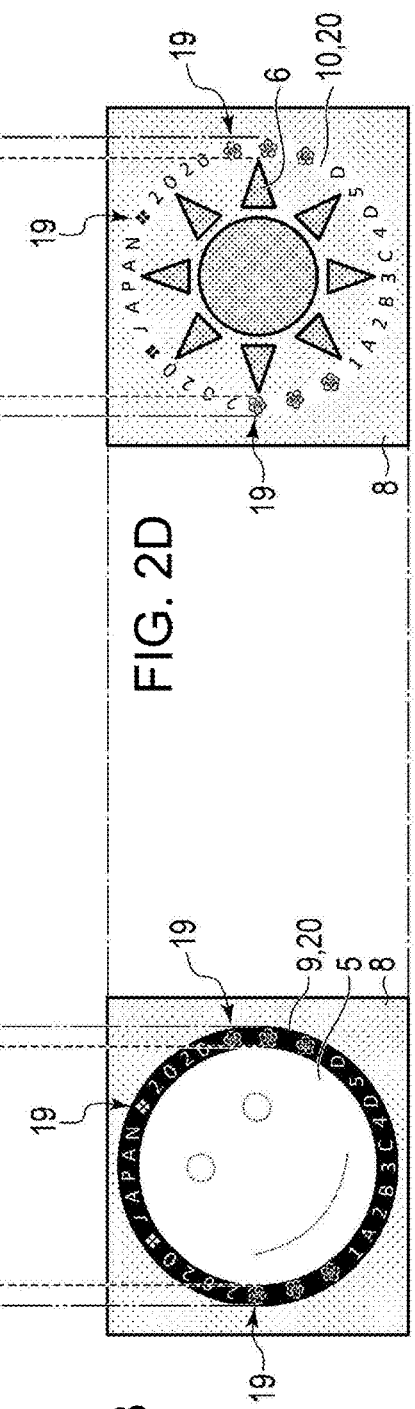

US 12,522,013 B2

THREE-DIMENSIONAL DISPLAY, AUTHENTICATION MEDIUM, AND FORMATION METHOD

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2022/022990, filed on Jun. 7, 2022, which is based upon and claims the benefit of priority to Japanese Patent Application No. 2021-096554, filed on Jun. 9, 2021, the disclosures of which are incorporated herein by reference in their entirety.

TECHNICAL FIELD

The embodiments of the present invention relate to authentication media which are attached to cards, passports, visas, etc., for example, to verify authenticity thereof, three-dimensional displays that can be applied to authentication media, and methods of forming three-dimensional displays.

BACKGROUND

As authentication media containing personal information, various identification (ID) cards such as passports and driver's licenses are known. Most ID cards have facial information and textual information displayed thereon to visually identify personal information. However, personal information simply printed on authentication media is vulnerable to tampering or counterfeiting.

As a method of preventing counterfeiting of authentication media, PTL 1 describes improving the anti-tampering properties of an authentication medium by transferring a hologram foil to the authentication medium. However, the anti-counterfeiting technique described in PTL 1 is already well known and will permit easy counterfeiting of holograms emitting simple iridescent diffraction light.

PTL 2 describes adding personal information using a fluorescent light-emitting material, so that the personal information is transparent and invisible when observed under visible light but is visible under ultraviolet observation.

PTL 3 describes, as another anti-counterfeiting method, performing authenticity verification using reproduced information displayed on a hologram by irradiating the hologram with light of a specific wavelength. However, in the technique described in PTL 3, the reproduced information is preset and invariant. Therefore, once a counterfeiter knows the reproduced information, they may produce a hologram imitating the reproduced information.

In this regard, laser interference holograms or CGH's (computer generated holograms) using computational laser interference calculation, which are characterized by three-dimensional viewing of the holograms utilizing binocular parallax, can have dynamic effects produced by the observer changing the viewing angle, and therefore, can achieve functions that cannot be achieved by generally used printed matter and thus are applied to various security labels in recent years.

Due to such dynamic effects, these types of holograms are characterized in that the image appears to pop out from the medium surface when it is reconstructed under a point light source; however, these holograms have a disadvantage that, if they are illuminated with a generally used elongated fluorescent lamp, multiple light sources, or a light with a large light-emitting surface, the reconstructed image may appear blurred.

In addition, the deeper the reconstructed image, the more pronounced the blurring. Thus, there is a trade-off relationship that if depth is added to create stronger stereoscopic effects, the reconstructed image is even more likely to become blurred.

Accordingly, in general, it is difficult to achieve both deeper stereoscopic effects and a clear reconstructed image.

In order to eliminate such blurring of a reconstructed image, techniques for blur-free CGH's composed of diffraction gratings have been developed as can be seen in Crystagrams as disclosed in PTL 4 or PhotoColor as disclosed in PTL 5.

According to these techniques, the reconstructed image is characterized in that it has no blur and is easily visible in any environment because the basic pattern appears to be the same to each eye, while the pattern appears to be different in color or luminance to each eye. However, this reconstructed image is disadvantageous in that it lacks stereoscopic effects. These diffraction gratings are not appropriate for machine reading.

Furthermore, the technique disclosed in PTL 6 is disadvantageous in that the pattern is displayed only on the front side of the authentication medium on which the facial image and identification information are provided and, in addition, due to the presence of the reflective layer, the pattern is not visible from the rear side, or cannot support production of a reconstructed image on the front side (e.g., it cannot promote enhancement of stereoscopic effects).

CITATION LIST

Patent Literature

PTL 1: JP H6-67592 A; PTL 2: JP 3198324 B; PTL 3: JP 4677683 B; PTL 4: JP 2011-248279 A; PTL 5: WO 2017/18718A1; PTL 6: WO 2020/004633A1; PTL 7: WO 2017/209113A1.

SUMMARY OF THE INVENTION

The present invention has been made in light of the circumstances set forth above and aims to provide a visually and machine-readable authentication medium which can suppress tampering or counterfeiting using a simple structure and can facilitate verification of authenticity, and to provide a three-dimensional display that can be applied to the authentication medium, and a method of forming the three-dimensional display.

To achieve the above aim, the present invention takes the following means.

A first aspect of the present invention is a three-dimensional display formed by arranging first element cells in which personal identification information is recorded, and second element cells carrying an authentication medium from which the personal identification information is visible, on a laminate sheet, wherein the display includes a first region and a second region formed by arranging a plurality of the first element cells and a plurality of the second element cells; the first element cells and the second element cells respectively form phase shift structures; in the first region and in the second region, respective three-dimensional structures are formed with spacers interposed between the first element cells and the second element cells; the first region and the second region residing in the three-dimensional structures form coherent and unified three-dimensional images with groups of reconstruction points produced by reflected light from the phase shift structures; a first reconstructed image is produced on a first side of the laminate sheet, at a position apparently separated from the laminate sheet, due to the phase shift structure formed by the first element cells; and a second reconstructed image is produced on a second side of the laminate sheet, at a position apparently separated from the laminate sheet, due to the phase shift structure formed by the second element cells.

A second aspect of the present invention is a three-dimensional display in which a first contour region surrounding a recorded first character, and a second contour region surrounding a recorded second character are arranged on a laminate sheet, wherein a plurality of first element cells in which personal identification information is recorded and a plurality of second element cells carrying an authentication medium from which the personal identification information is visible are arranged in the first contour region and in the second contour region to form respective phase shift structures; in the first contour region and in the second contour region, the first element cells and the second element cells are arranged in an interleaved manner at a predetermined ratio to form respective three-dimensional structures; the first contour region and the second contour region are visible respectively from first and second sides of the laminate sheet; a reconstructed image derived from the second contour region is produced on the first side of the laminate sheet, at a position apparently separated from the laminate sheet, due to the phase shift structure formed by the first element cells; and a reconstructed image derived from the first contour region is produced on the second side of the laminate sheet, at a position apparently separated from the laminate sheet, due to the phase shift structure formed by the second element cells.

A third aspect of the present invention is a three-dimensional display, wherein the three-dimensional display is configured by combining the three-dimensional display according to the first aspect of the present invention and the three-dimensional display according to the second aspect of the present invention.

A fourth aspect of the present invention is the three-dimensional display according to the third aspect, wherein a first marker is provided to the laminate sheet on which the three-dimensional display according to the first aspect is arranged; a second marker is provided to the laminate sheet on which the three-dimensional display according to the second aspect is arranged; and the three-dimensional display according to the first aspect and the three-dimensional display according to the second aspect are combined with each other by bringing the two laminate sheets into alignment using the first marker and the second marker.

A fifth aspect of the present invention is the three-dimensional display according to the fourth aspect, wherein the three-dimensional display according to the first aspect and the three-dimensional display according to the second aspect are overlapped and combined with each other.

A sixth aspect of the present invention is the three-dimensional display according to the first aspect, wherein a relation $Z1<Z2$ is established between a first distance $Z1$ that is a distance from the first side to the first reconstructed image and a second distance $Z2$ that is a distance from the second side to the second reconstructed image.

A seventh aspect of the present invention is the three-dimensional display according to the first or fifth aspect, wherein a relation $Z1>Z2$ is established between a first distance $Z1$ that is a distance from the first side to the first reconstructed image and a second distance $Z2$ that is a distance from the second side to the second reconstructed image.

An eighth aspect of the present invention is the three-dimensional display according to the second aspect, wherein a relation $Z4<Z3$ is established between a third distance $Z3$ that is a distance from the second side to the reconstructed image derived from the first contour region and a fourth distance $Z4$ that is a distance from the first side to the reconstructed image derived from the second contour region.

A ninth aspect of the present invention is the three-dimensional display according to the second or fifth aspect, wherein a relation $Z4>Z3$ is established between a third distance $Z3$ that is a distance from the second side to the reconstructed image derived from the first contour region and a fourth distance $Z4$ that is a distance from the first side to the reconstructed image derived from the second contour region.

A tenth aspect of the present invention is the three-dimensional display according to the first aspect, wherein the laminate sheet includes a recording surface, the recording surface including, calculated element sections corresponding one-to-one to reconstruction points of the first reconstructed image and the second reconstructed image, and subjected to phase component calculation for light from the individual reconstruction points, phase angle recording region in which phase angles calculated based on the phase components can be recorded, and a phase angle non-recording region in which the phase angles are not recorded; and the phase angles are recorded in an overlapping region where the calculated element sections overlap with the phase angle recording region.

An eleventh aspect of the present invention is the three-dimensional display according to the second aspect, wherein the laminate sheet includes a recording surface, the recording surface including, calculated element sections corresponding one-to-one to reconstruction points of the reconstructed image derived from the first contour region and the reconstructed image derived from the second contour region, and subjected to phase component calculation for light from the individual reconstruction points, a phase angle recording region in which phase angles calculated based on the phase components can be recorded, and a phase angle non-recording region in which the phase angles are not recorded; and the phase angles are recorded in an overlapping region where the calculated element sections overlap with the phase angle recording region.

A twelfth aspect of the three-dimensional display according to the tenth or eleventh aspect, wherein a plurality of the calculated element sections is provided; a phase component of light from each of the reconstruction points is calculated for a corresponding one of the plurality of calculated element sections; and the calculated phase angle is recorded in the corresponding one of the calculated element sections.

A thirteenth aspect of the present invention is the three-dimensional display according to any one of the tenth to twelfth aspects, wherein information other than the phase angles is recorded in the phase angle non-recording region.

A fourteenth aspect of the present invention is the three-dimensional display according to the thirteenth aspect, wherein the information other than the phase angles is information including at least one of light scattering, light reflection, and light diffraction.

A fifteenth aspect of the present invention is the three-dimensional display according to the tenth aspect, wherein the first region includes gradation values as data of a color image expressed by two or more colors, for each of the calculated element sections in terms of the individual colors; and the second region includes gradation values binarized based on the first region, for each of the calculated element sections.

A sixteenth aspect of the present invention is the three-dimensional display according to the eleventh aspect, wherein the first contour region includes gradation values as data of a color image expressed by two or more colors, for each of the calculated element sections in terms of the individual colors; and the second contour region includes gradation values binarized based on the first contour region, for each of the calculated element sections.

A seventeenth aspect of the present invention is an authentication medium including a laminate in which a transparent outer layer substrate, a phase shift substrate for receiving and modulating illumination light, a transparent intermediate substrate developing colors when exposed to laser light, and a core substrate are laminated, wherein at least a part of the core substrate includes a transparent non-printed portion; and the three-dimensional display according to any one of element sections 1 to 16 is embedded in the laminate.

An eighteenth aspect of the present invention is the authentication medium according to element section 17, wherein the first region and the second region of the three-dimensional display are visible from outside the laminate.

A nineteenth aspect of the present invention is a method of forming the three-dimensional structure in the three-dimensional display according to any one of element sections 1 to 16, wherein the first element cells and the second element cells are processed by externally applying laser light to the three-dimensional display to form the three-dimensional structure.

According to the present invention, there can be provided a visually and machine readable authentication medium which can suppress tampering or counterfeiting with a simple structure and can facilitate verification of authenticity, and to provide a three-dimensional display that can be applied to the authentication medium, and a method of forming the three-dimensional display.

According to the three-dimensional display of the first aspect, the first reconstructed image can be produced apparently separated from the first side of the laminate sheet (e.g., the front side as viewed from the observer), and the second reconstructed image can be produced apparently separated from the second side of the laminate sheet (e.g., the rear side as viewed from the observer).

In general, if only one reconstructed image is produced, the stereoscopic effects are achieved only at the reconstruction distance from the surface of the laminate sheet to the single reconstructed image. In this regard, in the three-dimensional display according to the first aspect, not only is the first reconstructed image produced apparently separated from the front side of the laminate sheet, but also the second reconstructed image is produced apparently separated from the rear side, i.e., two reconstructed images are produced. Accordingly, the observer can perceive the reconstruction distance from the reconstruction plane of the second reconstructed image to the reconstruction plane of the first reconstructed image and thus can feel stereoscopic effects, irrespective of the position of the authentication medium present therebetween. Also, this improves anti-counterfeiting properties or aesthetic properties.

At the same time, if the depths of the first and second reconstructed images are made substantially equal to each other, stereoscopic effects can be exerted even more by these depths.

According to the three-dimensional display of the second aspect, as in the three-dimensional display of the first aspect, two reconstructed images are produced, on the front and rear sides of the laminate sheet, and accordingly, stereoscopic effects can be achieved, irrespective of the position of the authentication medium present therebetween. Also, this improves anti-counterfeiting properties or aesthetic properties.

According to the three-dimensional display of the third aspect, a configuration in which the three-dimensional displays of the first and second aspects are combined is provided to further improve stereoscopic effects, anti-counterfeiting effects, and aesthetic properties.

According to the three-dimensional display of the fourth aspect, the three-dimensional displays of the first and second aspects can be combined through alignment using the markers provided to the respective laminate sheets. In this case, the three-dimensional displays of the first and second aspects are preferred to have the same area and the same shape. The markers can be provided at the boundary between the first element cells and the second element cells.

According to the three-dimensional display of the fifth aspect, the three-dimensional display of the first aspect and the three-dimensional display of the second aspect can be arranged so that the rear surface of the laminate sheet of the first aspect faces the front surface of the laminate sheet of the second aspect to establish a boundary between the first element cells and the second element cells. In this case also, the three-dimensional displays of the first and second aspects are preferred to have the same area and the same shape.

According to the three-dimensional display of the sixth aspect, the first reconstructed image can be made less likely to be blurred, irrespective of the illumination distance, the number of illumination sources, and the illumination size, while conversely, the second reconstructed image can be made observable with only a point light source. Furthermore, the first reconstructed image and the second reconstructed image can be produced adjacent to each other, so that the first reconstructed image that is visible even under ambient lighting can be produced simultaneously with the second reconstructed image that is produced with only a point light source.

According to the three-dimensional display of the seventh aspect, contrary to the three-dimensional display of the sixth aspect, the second reconstructed image can be made less likely to be blurred, irrespective of the illumination distance, the number of illumination sources, and the illumination size, and the first reconstructed image can be made observable with only a point light source. Furthermore, the second reconstructed image and the first reconstructed image can be produced adjacent to each other, so that the second reconstructed image that is visible even under ambient lighting can be produced simultaneously with the second reconstructed image that is produced with only a point light source.

According to the three-dimensional display of the eighth aspect, the fourth reconstructed image can be made less likely to be blurred, irrespective of the illumination distance, the number of illumination sources, and the illumination size, while conversely, the third reconstructed image can be made observable with only a point light source. Furthermore, the third reconstructed image and the fourth reconstructed image can be produced adjacent to each other, so that the fourth reconstructed image that is visible even under ambient lighting can be produced simultaneously with the third reconstructed image that is produced with only a point light source.

According to the three-dimensional display of the ninth aspect, contrary to the three-dimensional display of the eighth aspect, the third reconstructed image can be made less likely to be blurred, irrespective of the illumination distance, the number of illumination sources, and the illumination size, and the fourth reconstructed image can be made observable with only a point light source. Furthermore, the third reconstructed image and the fourth reconstructed image can be produced adjacent to each other, so that the third reconstructed image that is visible even under ambient lighting can be produced simultaneously with the fourth reconstructed image that is produced with only a point light source.

According to the three-dimensional displays of the tenth to fourteenth aspects, the phase angles required for producing a reconstructed image can be recorded in an overlapping region, so that the time required for computational phase angle calculation can be shortened.

According to the three-dimensional displays of the fifteenth and sixteenth aspects, the visible range of the personal identification information shown on the three-dimensional display can be changed, so that color changing effects can be imparted.

According to the three-dimensional displays of the seventeenth and eighteenth aspects, the three-dimensional display can be embedded in the laminate, so that an authentication medium that is visible from the front and rear sides of the laminate sheet can be provided.

According to the method of forming a three-dimensional display of the nineteenth aspect, the first element cells and the second element cells can be configured using materials having different wavelength absorptions, so that, for example, the element cells can be processed into desired shapes with an infrared laser having a wavelength of 1,064 nm, YVO/YAG laser, fiber laser, or CO2 laser (gas laser) having a wavelength of 10,600 nm. Furthermore, single- or multi-layer reflective layers made such as of Al or Ni and Ag or TiO2 can be provided to the three-dimensional structures, so that the reflective layers can also be processed into desired shapes.

BRIEF DESCRIPTION OF THE DRAWINGS

FIGS. 1A-1C are a set of diagrams in which FIG. 1B is a cross-sectional view illustrating a three-dimensional display according to the present embodiment, FIG. 1A is a plan view illustrating a first region and a first contour region, and FIG. 1C is a plan view illustrating a second region and a second contour region.

FIGS. 1D-1E are a set of diagrams in which FIG. 1D is a cross-sectional view illustrating the three-dimensional display shown in FIG. 1B covered with single- or multi-layer reflective layers, and FIG. 1E is a cross-sectional view illustrating the three-dimensional display in which the first region and the second region are separated from each other.

FIGS. 2A-2D are a set of diagrams in which FIG. 2A is a cross-sectional view illustrating a detailed configuration example of the upper surface of the display shown in FIG. 1B, FIG. 2B is a plan view corresponding to FIG. 1A, FIG. 2C is a cross-sectional view illustrating a detailed configuration example of the lower surface of the display shown in FIG. 1B, and FIG. 2D is a plan view corresponding to FIG. 1C.

FIGS. 11A and 11B are a set of diagrams in which FIG. 11A is a cross-sectional view illustrating a laminate before embedding a three-dimensional display and FIG. 11B is a cross-sectional view illustrating the laminate after embedding the three-dimensional display.

DETAILED DESCRIPTION

Figure 1A:
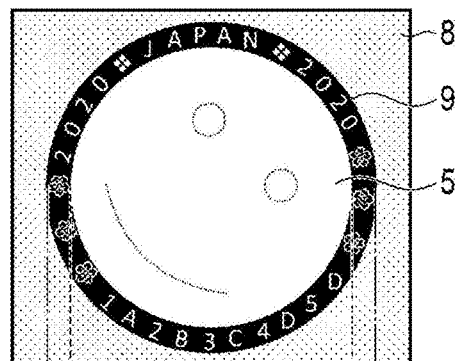

Hereinafter, embodiments of the present disclosure will be described with reference to the drawings as appropriate. However, the following embodiment is an example for describing the present disclosure and is not intended to limit the present disclosure to the following content. In the description, the same reference numerals are used for the same elements or elements having the same function, and repeated description is omitted in some cases. Moreover, the positional relationships, such as up and down, and left and right, are based on the positional relationships shown in the drawings unless otherwise specified. In addition, the dimensional ratios in the drawings are not limited to the ratios shown in the drawings.

Figure 1B:
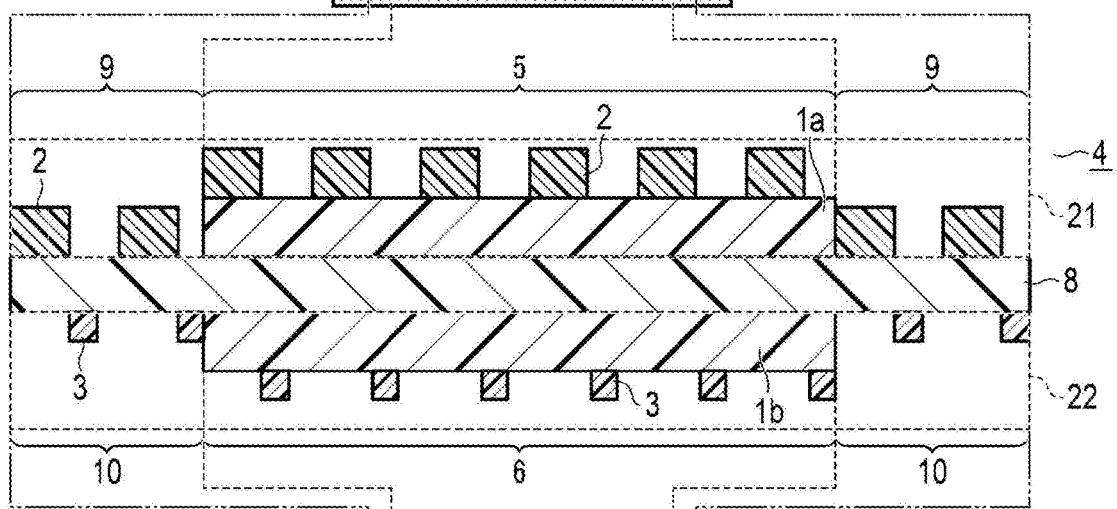
Figure 1C:
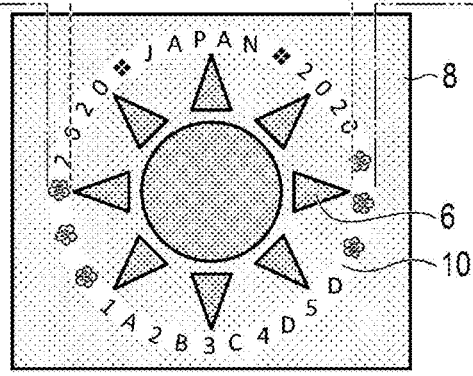

FIGS. 1A-1C are a set of diagrams in which FIG. 1B is a cross-sectional view illustrating a three-dimensional display according to the present embodiment, FIG. 1A is a plan view illustrating a first region and a first contour region, and FIG. 1C is a plan view illustrating a second region and a second contour region.

FIG. 2A is a cross-sectional view illustrating a detailed configuration example of the upper surface of the display shown in FIG. 1B, FIG. 2C is a cross-sectional view illustrating a detailed configuration example of the lower surface of the display shown in FIG. 1B, FIG. 2B is a plan view corresponding to FIG. 1A, and FIG. 2D is a plan view corresponding to FIG. 1C.

Figure 3A:
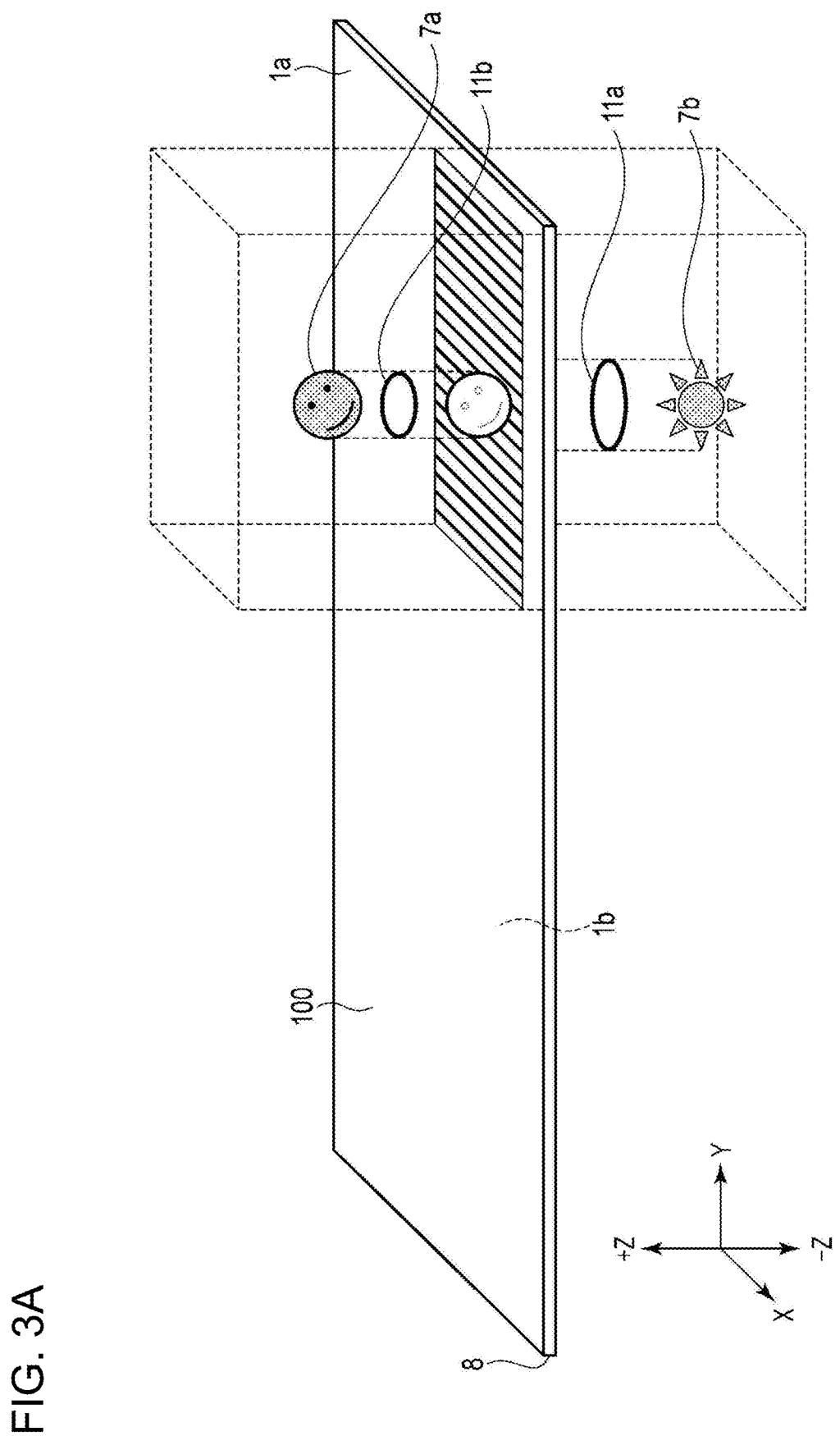
FIG. 3A is a perspective view illustrating a state in which images are reconstructed apparently separated from the front and rear surfaces of an authentication medium.

FIG. 3A is a perspective view illustrating a state in which images are reconstructed apparently separated from the front and rear surfaces of an authentication medium.

FIG. 3A shows a state in which a first reconstructed image 7a and a reconstructed image 11b derived from the second contour region respectively recorded in a first region 5 and a second contour region 10 are reconstructed on the front side, and a second reconstructed image 7b and a reconstructed image 11a derived from the first contour region respectively recorded in a second region 6 and a first contour region 9 are reconstructed on the rear side, in a three-dimensional display 4 according to the present embodiment.

As can be seen in the cross-sectional view shown in FIG. 1B, the three-dimensional display 4 according to the present embodiment has a configuration in which a plurality of first element cells 2 and a plurality of second element cells 3 are arranged on laminate sheets 1a and 1b. The laminate sheets 1a and 1b sandwich a laminate sheet 8 therebetween.

Personal identification information such as biometric data is recorded in the first element cells 2.

The second element cells 3 carry an authentication medium from which personal identification information is visible.

The three-dimensional display 4 includes the first region 5 (see FIG. 1A that is a plan view corresponding to the upper surface of the display shown in FIG. 1B) and the second region 6 (see FIG. 1C that is a plan view corresponding to the lower surface of the display shown in FIG. 1B), which are formed by arranging the plurality of first element cells 2 and the plurality of second element cells 3.

Respective phase shift structures are formed in the first element cells 2 and the second element cells 3.

Thus, by bringing hologram foils 21 and 22 having corresponding patterns into highly accurate alignment with each other and transferring them onto the front and rear surfaces of a transparent substrate such as the laminate sheet 8, the three-dimensional display 4 can form unified patterns in respective edge portions as shown, for example, in FIG. 1A as a pattern of the front surface and in FIG. 1C as a pattern of the rear surface. Alternatively, images can be formed by removing part of the front and rear surfaces using a laser for demetallization. With this treatment, even any slight misalignment between the hologram foils 21 and 22 on the front and rear sides becomes visible at a glance, achieving both of resistance to counterfeiting and easy authenticity verification.

FIG. 2A is a cross-sectional view illustrating a detailed configuration example of the upper surface of the display shown in FIG. 1B and FIG. 2C is a cross-sectional view illustrating a detailed configuration example of the lower surface of the display shown in FIG. 1B.

As shown in FIGS. 2A and 2C, the first element cells 2 and the second element cells 3 are arranged at a predetermined ratio in an interleaved manner in each of the first and second regions 5 and 6. This forms three-dimensional structures.

Referring back to FIG. 1B, the first and second regions 5 and 6 residing in the three-dimensional structures form coherent and unified three-dimensional images with groups of reconstruction points produced by reflected light from the phase shift structures, and these images are visible from different sides of the laminate sheet 8. For example, the first region 5 is visible from above in FIG. 1B, while the second region 6 is visible from below in FIG. 1B. Being coherent can refer to a pattern in a region being able to enter a region having no pattern. Also, being coherent can refer to a single motif being formed using front and rear patterns. The motif may be formed with letters, symbols, marks, or decorations.

As shown in FIG. 3A, due to the phase shift structure formed by the first element cells 2, the first reconstructed image 7a is produced on the first surface (e.g., the front surface that is the upper surface in the figure) side of the laminate sheet 8, at a position apparently separated from the laminate sheet 1a. Also, as shown in FIG. 3A, due to the phase shift structure formed by the second element cells 3, the second reconstructed image 7b is produced on the second surface (e.g., the rear surface that is the lower surface in the figure) side of the laminate sheet 8, at a position apparently separated from the laminate sheet 1b.

Referring back to FIG. 2B, a first character (e.g., face), which is recorded in the first region 5, is surrounded by the first contour region 9.

Referring back to FIG. 2D, a second character (e.g., the sun), which is recorded in the second region 6, is surrounded by the second contour region 10.

The first contour region 9 and the second contour region 10 are also provided with respective phase shift structures with a plurality of first and second element cells 2 and 3 arranged.

As shown in FIGS. 2A and 2C, the first element cells 2 and the second element cells 3 are arranged at a predetermined ratio in an interleaved manner in the first and second contour regions 9 and 10 to form three-dimensional structures.

The first and second contour regions 9 and 10 are visible from different sides of the laminate sheet 8. For example, as shown in FIGS. 1B and 1A, the first contour region 9 is visible from the front side that is the upper side in the figure, and, as shown in FIGS. 1B and 1C, the second contour region 10 is visible from the rear side that is the lower side in the figure.

As shown in FIG. 3A, due to the phase shift structure formed by the first element cells 2, the reconstructed image 11b derived from the second contour region is produced on the first surface (e.g., the front surface that is the upper side in the figure) side of the laminate sheet 8, at a position apparently separated from the laminate sheet 1a. Also, due to the phase shift structure formed by the second element cells 3, the reconstructed image 11a is produced on the second surface (e.g., the rear surface that is the lower side in the figure) side of the laminate sheet 8, at a position apparently separated from the laminate sheet 1b.

Thus, the first reconstructed image 7a and the reconstructed image 11b which is derived from the second contour region can be produced on the upper side in FIG. 3, being overlapped with each other. If only one of the first reconstructed image 7a and the reconstructed image 11b which is derived from the second contour region is produced, only poor three-dimensional effects can be achieved. In this regard, the three-dimensional display 4 can produce the first reconstructed image 7a and the reconstructed image 11b which is derived from the second contour region being overlapped with each other, and therefore, the observer can feel an enhanced sense of depth. Part of the plane configured by the point groups of the first region 5 may be made parallel to part of the plane configured by the point groups of the second region 6. With this configuration, a multilayered composite image can be displayed.

Similarly, the second reconstructed image 7b and the reconstructed image 11a which is derived from the first contour region can be produced on the lower side in FIG. 3A, being overlapped with each other. If only one of the second reconstructed image 7b and the reconstructed image 11a which is derived from the first contour region is produced, only poor three-dimensional effects can be achieved. In this regard, the three-dimensional display 4 can produce the second reconstructed image 7b and the reconstructed image 11a which is derived from the first contour region, being overlapped with each other, and therefore, the observer can feel an enhanced sense of depth. Part of the plane configured by the point groups of the first contour region 9 may be made parallel to part of the plane configured by the point groups of the second contour region 10. With this configuration, a multilayered reconstructed image can be displayed.

In the three-dimensional display 4, the first region 5 producing the first reconstructed image 7a can be arranged adjacent to the second region 6 which is configured by a diffraction grating that diffracts light with different pitches and azimuth angles in specific directions. The first region 5 may include a plurality of phase angle recording regions. The second region 6 may include a plurality of phase angle recording regions in which either or both of the pitches and azimuth angles are different between the regions. The phase angle recording region will be described later referring to FIG. 10.

The three-dimensional display 4 includes contour portions 20 including alignment markers 19, using which, the first contour region 9 is arranged adjacently to the second contour region 10 configured by a diffraction grating that diffracts light with different pitches and azimuth angles in specific directions.

The first contour region 9 may also include a phase angle recording region described later. Similarly, the second contour region 10 may include phase angle recording regions, described later, in which either or both of the pitches and azimuth angles are different between the regions.

The areas of the first region 5 and the first contour region 9 can be made equal to or larger than those of the second region 6 and the second contour region 10.

The first region 5 and the first contour region 9 may be arranged adjacent to the second region 6 and the second contour region 10 with a predetermined gap therebetween. However, in this case, luminance of the reconstructed images 7a, 7b, 11a and 11b may become dim depending on the area of the phase angle recording region described later. Accordingly, luminance can be adjusted by changing the areas of the first element cells 2 and the second element cells 3 in the first region 5, the first contour region 9, the second region 6, and the second contour region 10.

The first element cells 2 and the second element cells 3 can be individually arranged with appropriate intervals therebetween, i.e., can be arranged away from each other via spacers, e.g., can be arranged being interleaved with each other at a predetermined ratio, to provide intervals with which the observer can simultaneously visually recognize them. The predetermined ratio can refer to the ratio between the first element cells 2 and the second element cells 3 in a unit area of calculated element sections described later. The first element cells 2 may be the same in size as the second element cells 3. The first element cells 2 may be the same in shape as the second element cells 3.

The size of the first and second element cells 2 and 3 can be 5 μm or more and 150 μm or less. This size can be the length of the short side of each of the first and second element cells 2 and 3. Alternatively, this size can be the length of the short side of the rectangle circumscribing each of the first and second element cells 2 and 3.

Figure 1D:
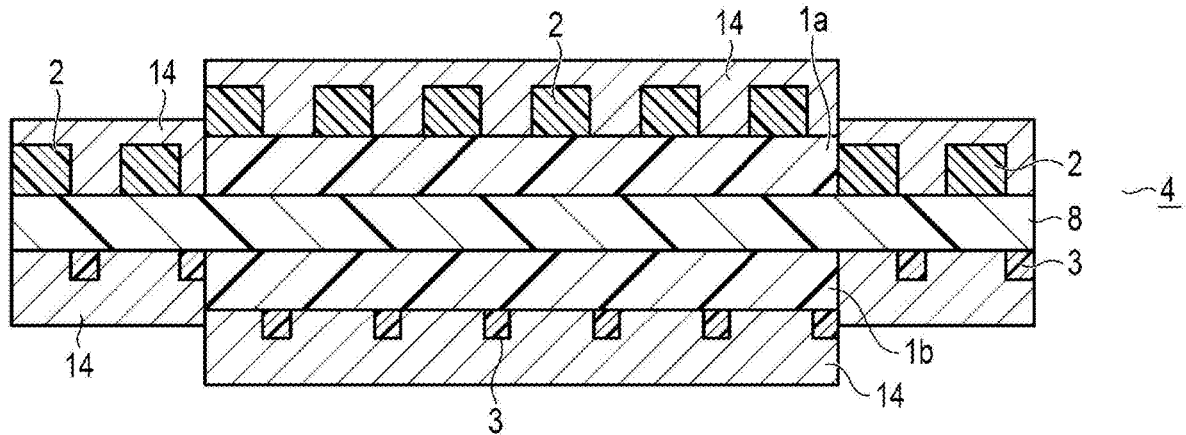
Figure 1E:
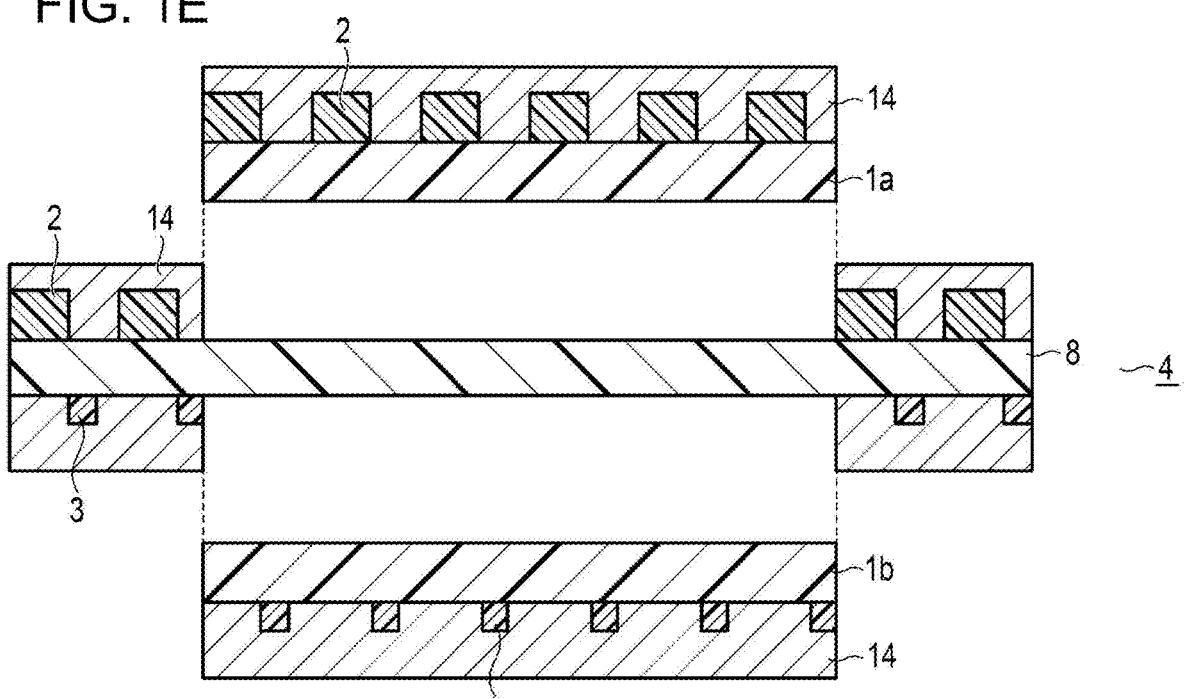

FIG. 1D is a cross-sectional view illustrating the three-dimensional display 4 shown in FIG. 1B covered with single- or multi-layer reflective layers 14.

Figure 2E:
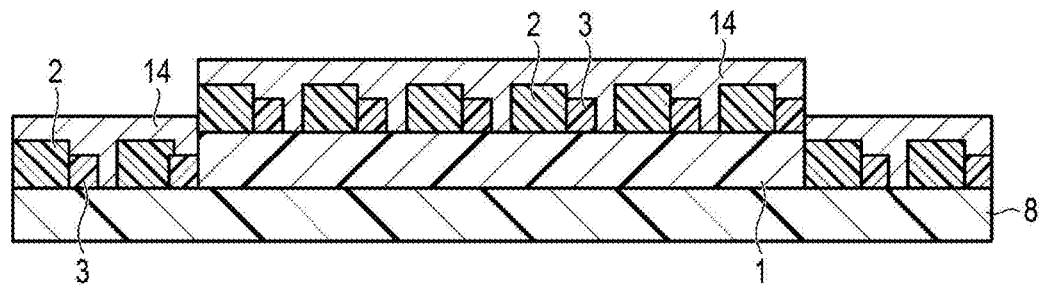
FIGS. 2E and 2F are a set of cross-sectional views corresponding to FIGS. 2A and 2C, illustrating configurations in which first element cells and second cells shown in FIGS. 2A and 2C are covered with single- or multi-layer reflective layers.
Figure 2F:
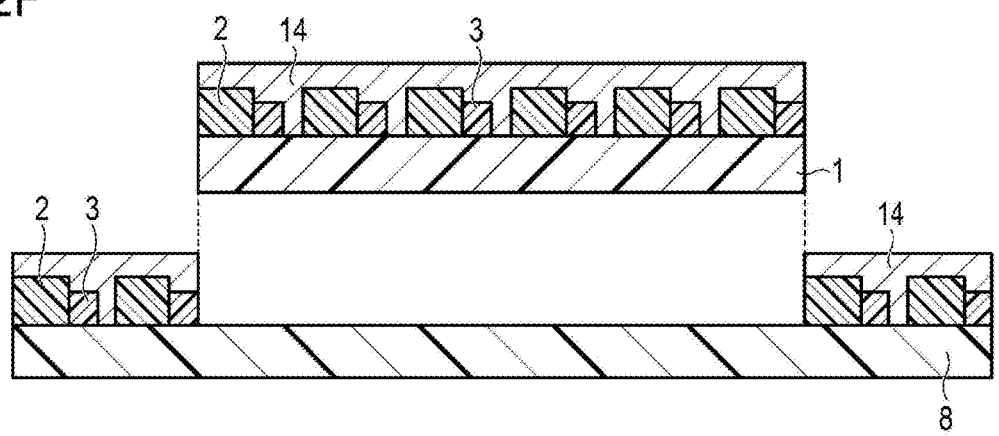

FIG. 2E is a cross-sectional view corresponding to FIGS. 2A and 2C, in which the first and second element cells 2 and 3 shown in FIGS. 2A and 2C are covered with single- or multi-layer reflective layers 14.

Figure 3B:
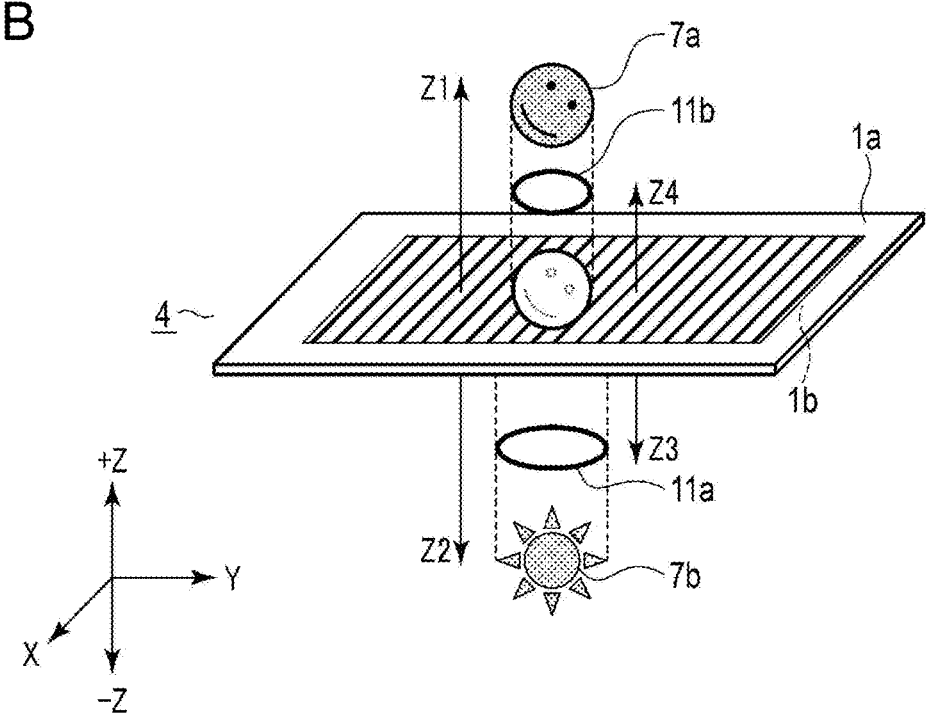
FIG. 3B is a perspective view illustrating a positional relationship between the reconstructed images shown in FIG. 3A.

FIG. 3B is a perspective view illustrating a positional relationship between the reconstructed images 7a, 7b, 11a and 11b shown in FIG. 3A.

In FIG. 3B, a first distance Z1 indicates a distance from a first surface (e.g., the upper surface in the figure) of the laminate sheet 1a to the first reconstructed image 7a. Also, a second distance Z2 indicates a distance from a second surface (e.g., the lower surface in the figure) of the laminate sheet 1b to the second reconstructed image 7b. Also, a third distance Z3 indicates a distance from the second surface (e.g., the lower surface in the figure) of the laminate sheet 1b to the reconstructed image 11a derived from the first contour region. Furthermore, a fourth distance Z4 indicates a distance from the first surface (e.g., the upper surface in the figure) of the laminate sheet 1a to the reconstructed image 11b derived from the second contour region. In FIG. 3B, relations Z1<Z2 and Z4<Z3 are established.

Figure 4A:
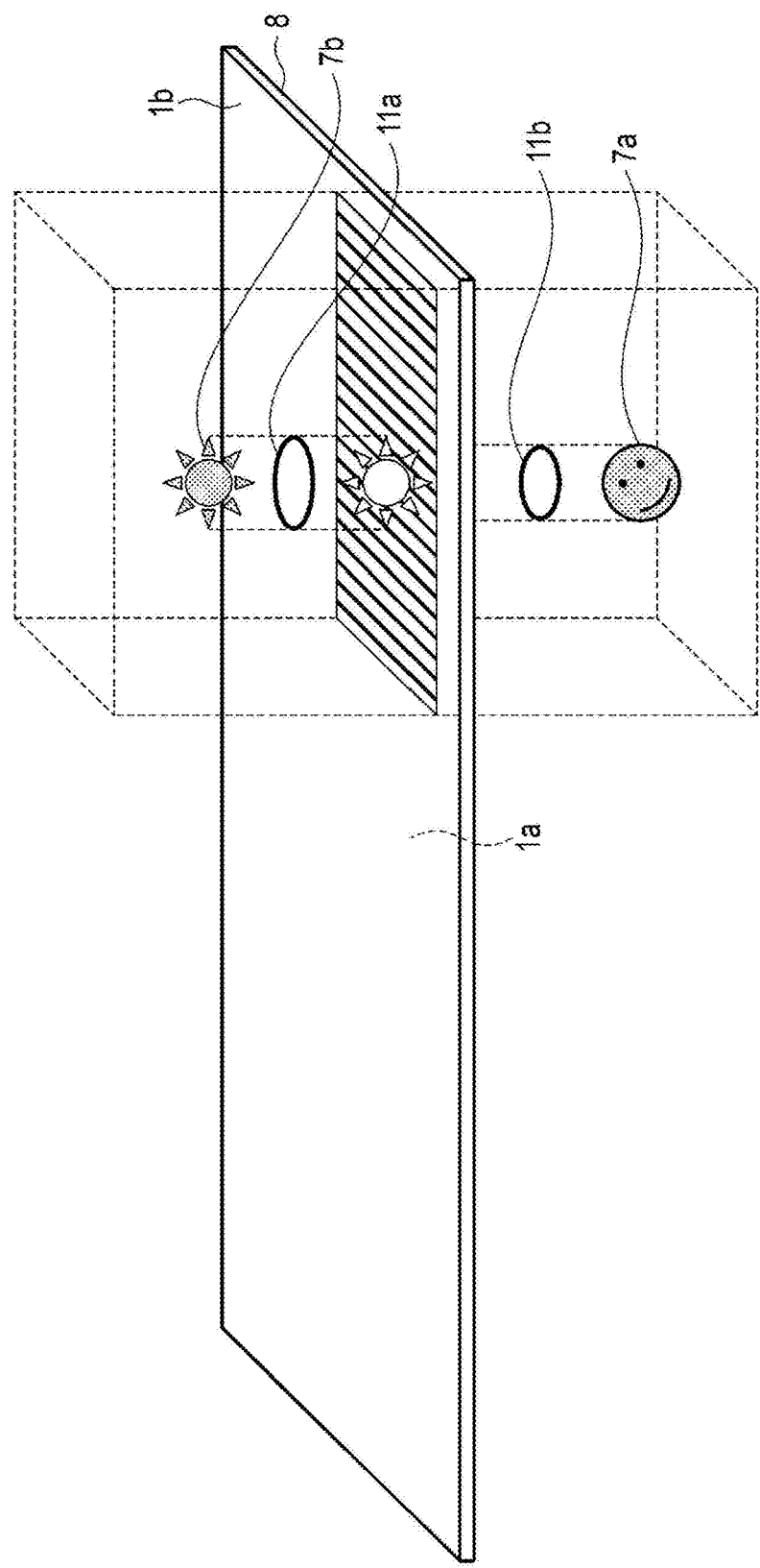
FIG. 4A is a diagram illustrating reconstructed images reversed in position from those in the authentication medium shown in FIG. 3A.

FIG. 4A is a diagram illustrating reconstructed images reversed in position from those in the authentication medium 100 shown in FIG. 3A.

In the case as shown in FIG. 4A, a first reconstructed image 7a and a reconstructed image 11b which is derived from the second contour region are formed on the lower side in the figure, at a position apparently separated from the laminate sheet 1a, and a second reconstructed image 7b and a reconstructed image 11a which is derived from the first contour region are formed on the upper side in the figure, at a position apparently separated from the laminate sheet 1b.

Figure 4B:
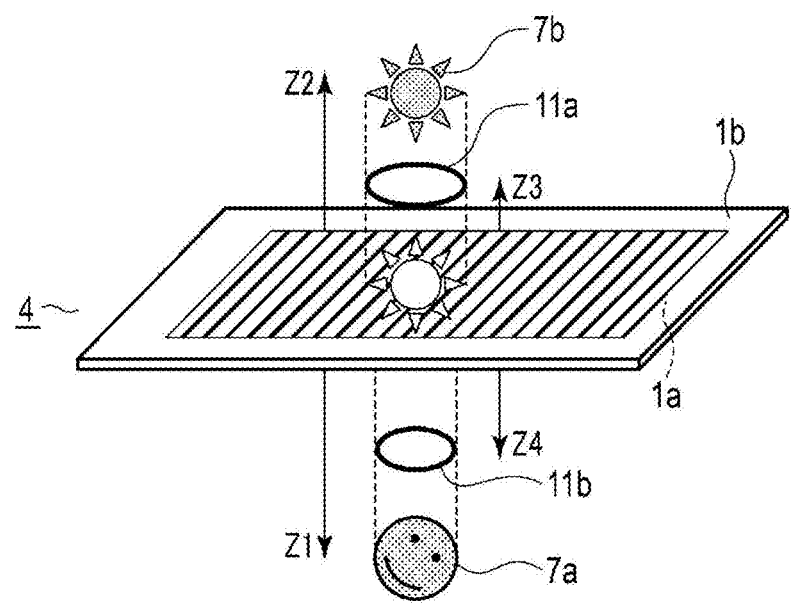
FIG. 4B is a perspective view illustrating a positional relationship between the reconstructed images shown in FIG. 4A.

FIG. 4B is a perspective view illustrating a positional relationship between the reconstructed images 7a, 7b, 11a and 11b shown in FIG. 4A.

In FIG. 4B, relations Z1>Z2 and Z4>Z3 are established, contrary to FIG. 3B.

FIGS. 3A and 4A indicate that the first and second reconstructed images 7a and 7b recorded as structures having a phase shift function in the first and second regions 5 and 6 can be observed under illumination light. In other words, illumination can produce the first and second reconstructed images 7a and 7b which are recorded as structures having a phase shift function in the phase angle recording region described later.

The first reconstructed image 7a, the second reconstructed image 7b, the reconstructed image 11a derived from the first contour region, and the reconstructed image 11b derived from the second contour region are each configured by a plurality of reconstruction points. In other words, the first reconstructed image 7a, the second reconstructed image 7b, the reconstructed image 11a derived from the first contour region, and the reconstructed image 11b derived from the second contour region are displayed as groups of reconstruction points.

Referring back to FIG. 3A, the first reconstructed image 7a represents a face, and the second reconstructed image 7b represents the sun. In other words, the first and second reconstructed images 7a and 7b may be different images. The first and second reconstructed images 7a and 7b may be the same or different in size. For example, the ratio of the convexity area between the first and second reconstructed images 7a and 7b may be 1:2 or more and 2:1 or less.

The size of the first reconstructed image 7a may be smaller than the size of the second reconstructed image 7b. In this case, for example, the ratio of the convexity area between the first and second reconstructed images 7a and 7b may be 1:10 or more and less than 1:2.

With respect to the three-dimensional display 4, the first reconstructed image 7a is produced facing the observer, i.e., produced on the front side, and the second reconstructed image 7b is produced on the rear side relative to the observer. FIG. 4A shows the state on the rear surface, where the expression is the opposite of that in FIG. 3A described above.

In the example shown in FIG. 3A, the reconstructed image 11a derived from the first contour region is shown in white on a black background, while the reconstructed image 11b derived from the second contour region is shown in black on a white background. In other words, the reconstructed image 11a derived from the first contour region may be different from the reconstructed image 11b derived from the second contour region. The reconstructed image 11a derived from the first contour region and the reconstructed image 11b derived from the second contour region may have the same size. For example, relating to the first and second reconstructed images 7a and 7b, the ratio of the convexity area between the reconstructed images 11a and 11b derived from the first and second contour regions may be 1:2 or more and 2:1 or less.

The size of the reconstructed image 11a derived from the first contour region may be smaller than the size of the reconstructed image 11b derived from the second contour region. For example, the ratio of the convexity area between the reconstructed images 11a and 11b derived from the first and second contour regions may be 1:10 or more and less than 1:2.

With respect to the three-dimensional display 4, the reconstructed image 11b derived from the second contour region is produced facing the observer, i.e., produced on the front side, and the reconstructed image 11a derived from the first contour region is produced on the rear side relative to the observer. FIG. 4A shows the state on the rear surface, where the expression is the opposite of that in FIG. 3A described above.

As shown in FIG. 3A, due to the structure of the authentication medium 100 having a phase shift function, the first reconstructed image 7a, the second reconstructed image 7b, the reconstructed image 11a derived from the first contour region, and the reconstructed image 11b derived from the second contour region, which are planar reconstructed images, are produced in space, appearing at positions separated from the three-dimensional display 4. In other words, the structures having a phase shift function can produce the planar reconstructed images 7a, 7b, 11a and 11b in space. The reconstructed images 7a, 7b, 11a and 11b can have curved surfaces. In this case, the stereoscopic effects perceived by the observer when observing the images become greater in proportion to the reproduction distances to the reconstructed images, i.e., the distances between the centers of the reconstructed images 7a, 7b, 11a and 11b and the front surface of the three-dimensional display 4 (distances Z1, Z2, Z3 and Z4 described above).

However, if the reconstruction distances are excessively increased, the images may be blurred under a point light source. Therefore, the reconstruction distances are preferred to be set within a range not causing blurring. As shown in FIG. 3A, the three-dimensional display 4 produces the reconstructed images 7a, 7b, 11a and 11b in the space on the front side and in the space on the rear side. This can increase the stereoscopic effects, while suppressing blurring of the reconstructed images 7a, 7b, 11a and 11b.

FIGS. 3B and 4B both show examples in each of which the reconstruction distance Z1 from the three-dimensional display 4 to the first reconstructed image 7a is different from the reconstruction distance Z2 from the three-dimensional display 4 to the reconstructed image 7b; however, FIG. 4B shows an example in which the front and rear sides of the three-dimensional display 4 are reversed to produce the two reconstructed images 7a and 7b in the opposite direction to FIG. 3B.

FIGS. 3B and 4B both show examples in each of which the reconstruction distance Z3 from the three-dimensional display 4 to the reconstructed image 11a derived from the first contour region is different from the reconstruction distance Z4 from the three-dimensional display 4 to the reconstructed image 11b derived from the second contour region. FIG. 3B shows an example in which the reconstructed images 11a and 11b derived from the first and second contour regions are produced on different sides sandwiching the three-dimensional display 4, and FIG. 4B shows an example in which the front and rear sides of the three-dimensional display 4 shown in FIG. 3B are reversed to produce the reconstructed images 11a and 11b derived from the first and second contour regions in the opposite direction to FIG. 3B.

Referring to FIGS. 3B and 4B, security effects achieved by the three-dimensional display 4 will be described.

In the example shown in FIG. 3B, the reconstruction distance Z1 from the three-dimensional display 4 to the first reconstructed image 7a is different from the reconstruction distance Z2 from the three-dimensional display 4 to the second reconstructed image 7b, satisfying a relation Z2<Z1. Also, the reconstruction distance Z3 from the three-dimensional display 4 to the reconstructed image 11a derived from the first contour region is different from the reconstruction distance Z4 from the three-dimensional display 4 to the reconstructed image 11b derived from the second contour region, satisfying a relation Z4<Z3.

FIG. 4B shows a state in which the three-dimensional display 4 shown in FIG. 3B is viewed from the rear side, and effects that are reversed from FIG. 3B are obtained as an expression, satisfying relations Z1<Z2 and Z3<Z4.

Although not shown, the three-dimensional display 4 may be configured such that the first and second reconstructed images 7a and 7b are both produced on the front side, or conversely, both produced on the rear side.

Similarly, the three-dimensional display 4 may be configured such that the reconstructed images 11a and 11b derived from the first and second contour regions are both produced on the front side, or conversely, both produced on the rear side.

According to the authentication medium 100 shown in FIG. 3A, when the medium is observed in the frontal direction, i.e., observed in the direction normal to the surface of the laminate sheet 1*a*, under ambient lighting, the first reconstructed image 7*a* and the reconstructed image 11*b* which is derived from the second contour region are visible. However, as the observation direction is deviated from the frontal direction, increasing the viewing angle accordingly, the reconstructed images 7*a* and 11*b* are blurred accordingly and become invisible, while only the second reconstructed image 7*b* and the reconstructed image 11*a* which is derived from the first contour region become visible.

However, under lighting using a point light source instead of ambient lighting, the first reconstructed image 7*a* and the reconstructed image 11*a* which is derived from the first contour region are clearly visible even when the reconstruction distances Z2 and Z3 or the viewing angle become large. Also, the second reconstructed image 7*b* and the reconstructed image 11*b* which is derived from the second contour region are clearly visible. Therefore, the contrast between the first and second reconstructed images 7*a* and 7*b* can provide a visual sense of depth.

The structure having a phase shift function of reconstructing reconstruction points can be achieved by calculating phases in the structure having a phase shift function from the optical distances and wavelengths of the individual reconstruction points using the CGH technique, and by recording the structure having a phase shift function of shifting phases of incident light according to the calculated phases, in the phase angle recording region (described later) of the first region 5, the first contour region 9, the second region 6, or the second contour region 10.

A structure having a phase shift function can also be recorded as a relief structure or can be recorded as modulations of refractive indices, in the phase angle recording region described later.

In the case of recording phase differences as a relief structure, the recording is performed as follows. First, a resist plate that is a glass plate to which an electron beam resist is applied is exposed to an electron beam with a dose corresponding to the amount of phase shift, and the resist plate is developed to form asperities corresponding to the amount of phase shift. Next, a metal layer is deposited on the asperities formed on the resist plate to prepare a master plate. Next, a nickel shim on which the asperities are duplicated is electroformed from the master plate. The duplicated shim is embossed on a film including a carrier to which a resin is applied, to record the relief structure in the resin. In this way, the structure having a phase shift function recorded as a relief structure is excellent for mass production. The resin on which the relief structure is embossed may be a thermoplastic resin, thermosetting resin, or a composite of these resins. In particular, the composite of a thermoplastic resin and a thermosetting resin is able to record phases therein in the form of a highly accurate relief structure, and therefore, reconstruction points can be recorded with a high density. In addition, the three-dimensional display 4, in which the relief structure is recorded, can easily be destroyed if heated and peeled off from the adherend for the purpose of tampering, and thus can have high tamper resistance.

When forming a single-sided relief structure, a relief structure including the first region 5, first contour region 9, second region 6, and second contour region 10 is formed on one side.

When forming a double-sided relief structure, two single-sided relief structures including the first region 5, first contour region 9, second region 6, and second contour region 10 are formed, with alignment markers 19 provided on blank areas of the laminate sheets, these two relief structures are bonded together while being aligned using the markers 19, and the blank areas including the markers are cut off or the markers are removed by demetallization to leave them as patterns.

Next, referring to FIGS. 5A, 5B, 6A, 6B, 7A-7D, and 8A-8D, a method of forming the three-dimensional structure of the three-dimensional display 4 will be described.

FIGS. 5A, 5B, 6A, 6B, 7A-7D, and 8A-8D show a method of forming the three-dimensional structure of the three-dimensional display 4.

Figure 5A:
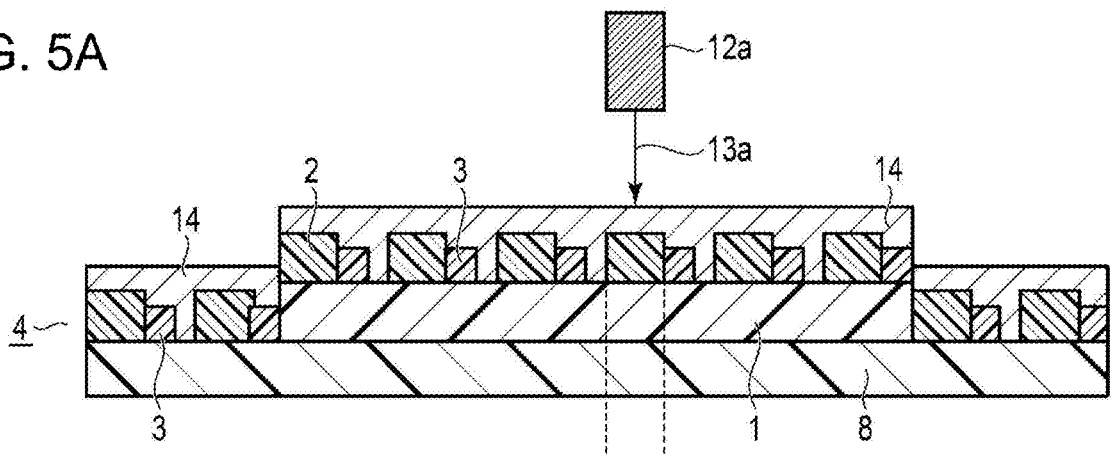
FIGS. 5A and 5B are a set of diagrams illustrating a method of forming a three-dimensional structure of a three-dimensional display.
Figure 5B:
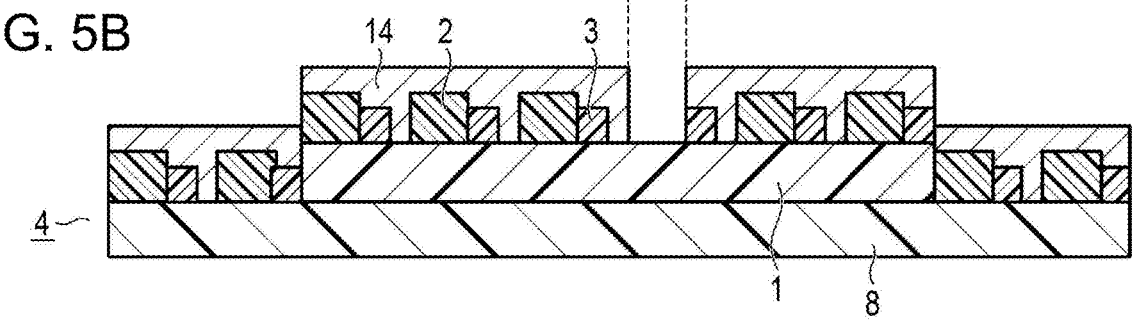
Figure 7A:
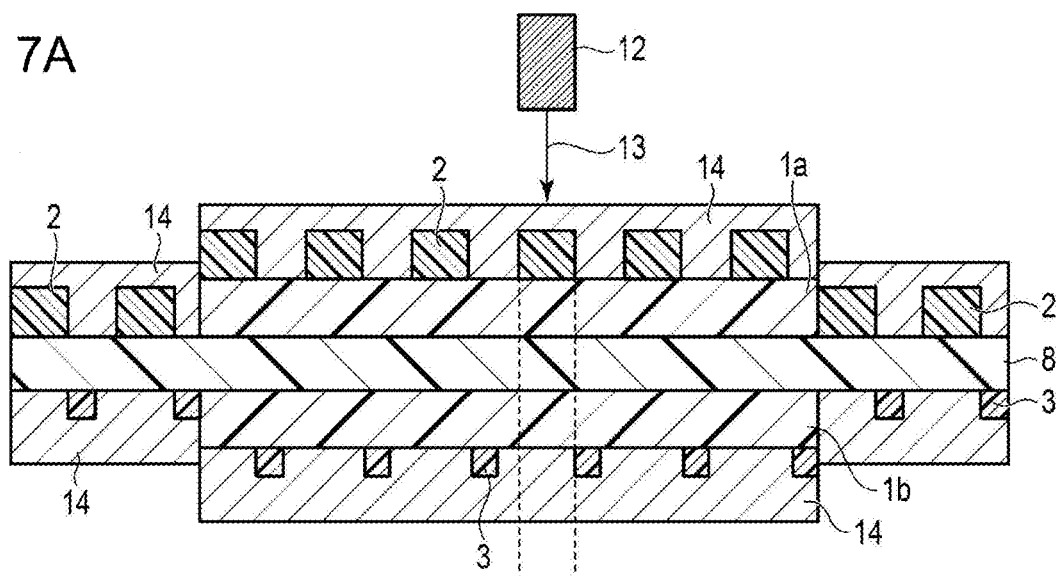
FIGS. 7A and 7B are a set of diagrams illustrating a method of forming a three-dimensional structure of a three-dimensional display.
Figure 7B:
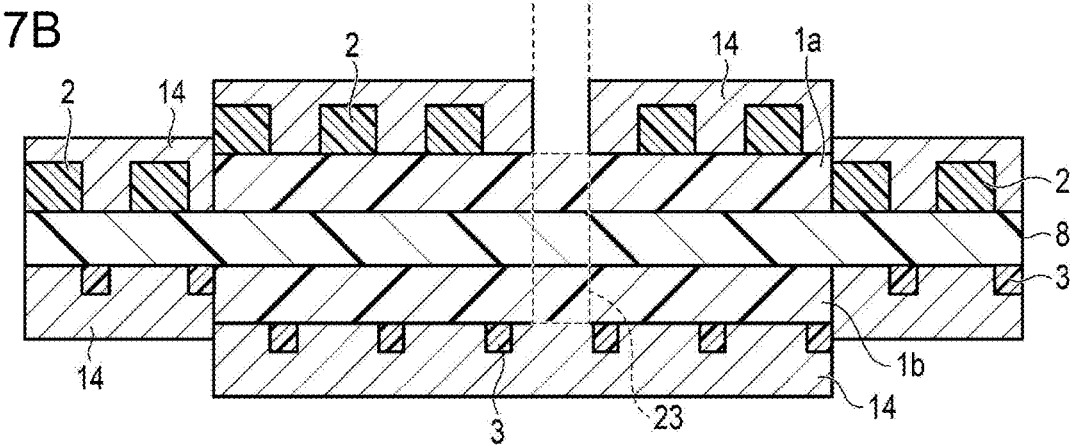
Figure 7C:
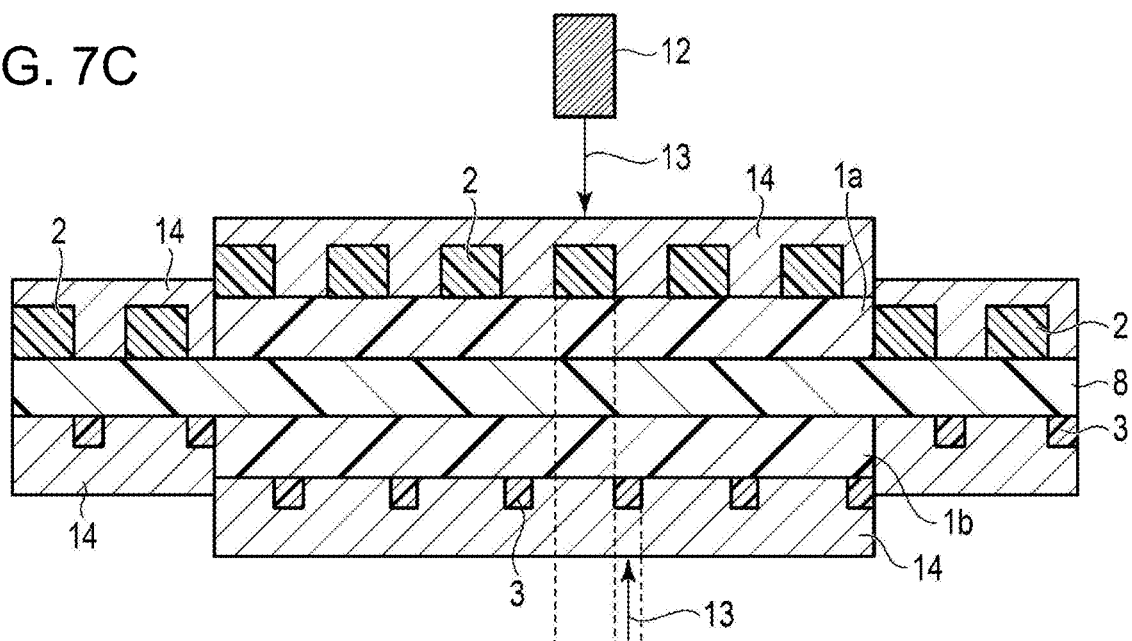
FIGS. 7C and 7D are a set of diagrams illustrating a method of forming a three-dimensional structure of a three-dimensional display.
Figure 7D:
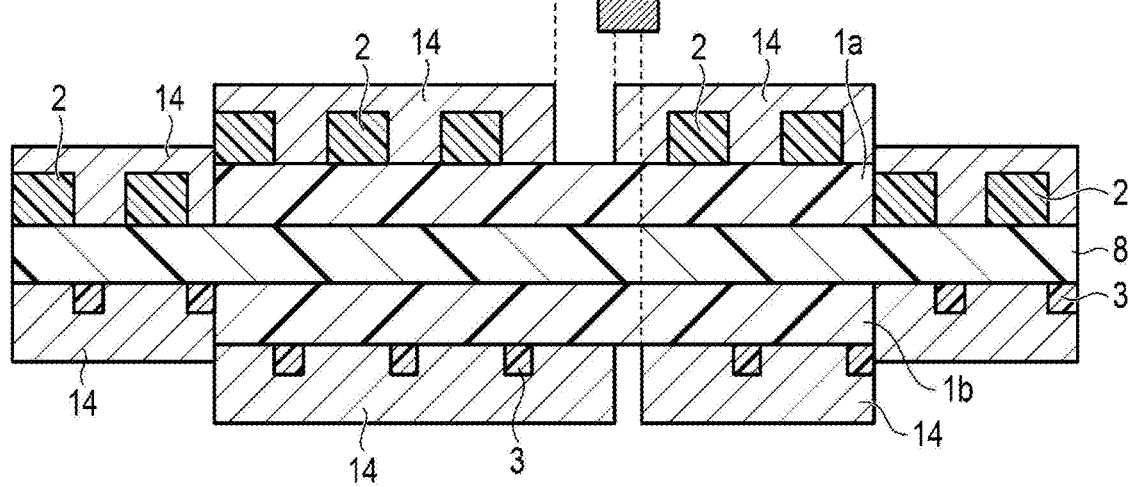

As shown in FIGS. 5A, 7A and 7C, high intensity laser light 13*a* is applied to one side or both sides of the three-dimensional display 4 from a laser irradiation device 12*a*. Thus, the first element cells 2 and/or the second element cells 3 forming the three-dimensional structure of a resin are melted and the single- or multi-layer reflective layer 14 on the laminate sheet 1 is evaporated, thereby partly demetallizing the hologram foil on the front side with a laser, as shown in FIGS. 5B, 7B and 7D.

As the laser irradiation device 12, an infrared laser having a wavelength of 1,064 nm, YVO/YAG laser, fiber laser, or $CO_2$ laser (gas laser) having a wavelength of 10,600 nm can be used.

The material of the reflective layer 14 may be metal or a metal compound, or silicon oxide. The metal compound may be a metal oxide, metal sulfide, or metal fluoride. These metal compounds are less likely to be chemically altered and can retain the reconstructed images recorded in the recording regions for a long time.

The metal sulfide may be zinc sulfide. The metal oxide may be titanium dioxide. The metal fluoride may be magnesium fluoride. The metal may be aluminum, silver, tin, nickel, chromium, elemental gold, or an alloy thereof. In particular, aluminum, which forms a passive layer, has high durability and thus can retain the reconstructed images recorded in the recording regions for a long time.

Figure 6A:
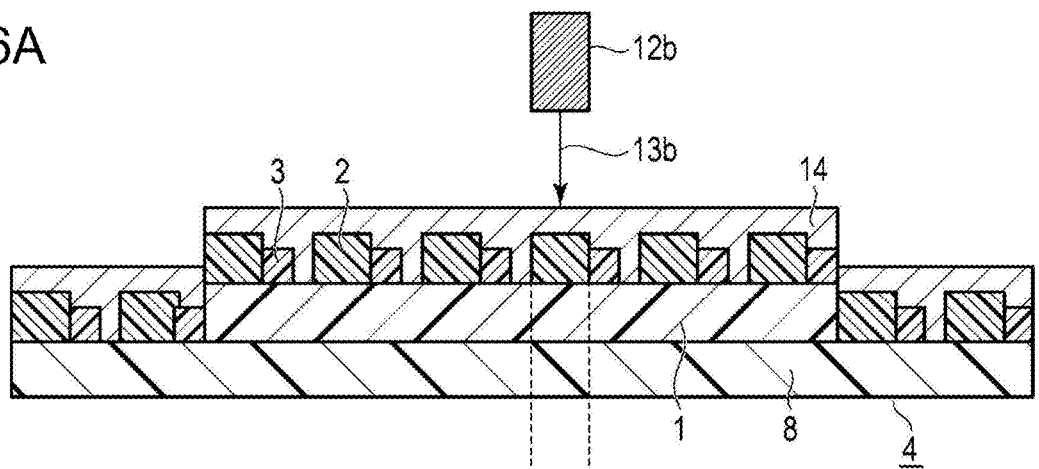
FIGS. 6A and 6B are a set of diagrams illustrating a method of forming a three-dimensional structure of a three-dimensional display.
Figure 6B:
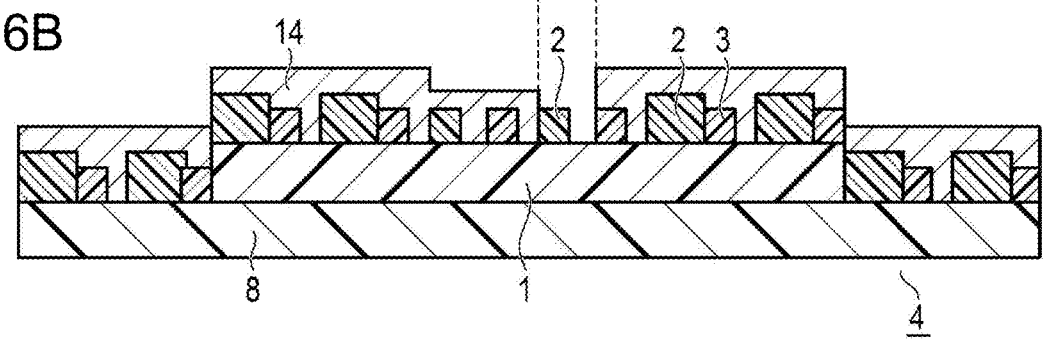
Figure 8A:
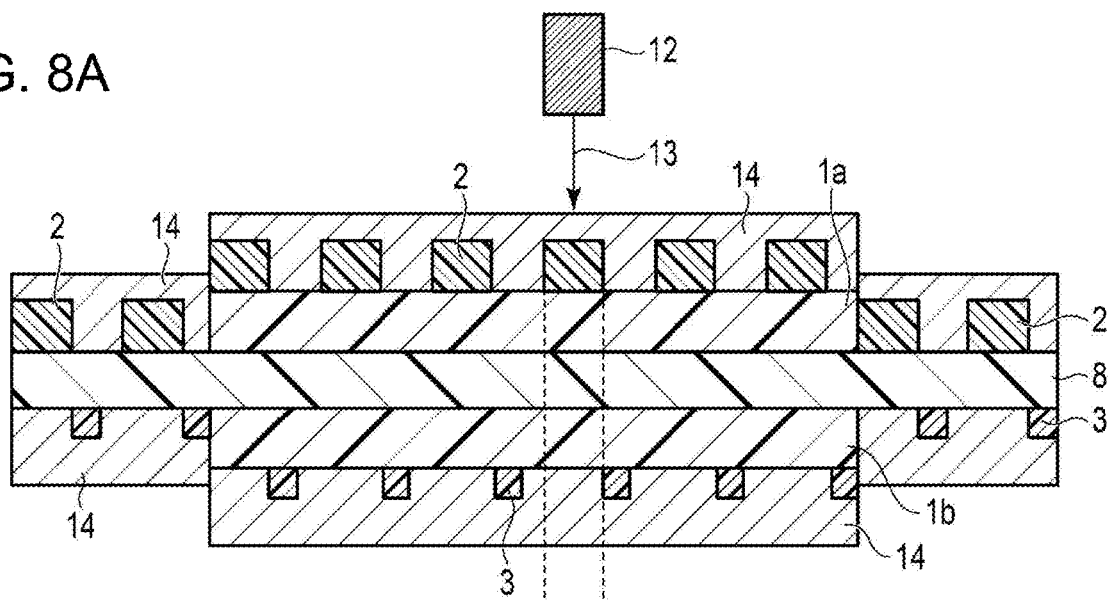
FIGS. 8A and 8B are a set of diagrams illustrating a method of forming a three-dimensional structure of a three-dimensional display.
Figure 8B:
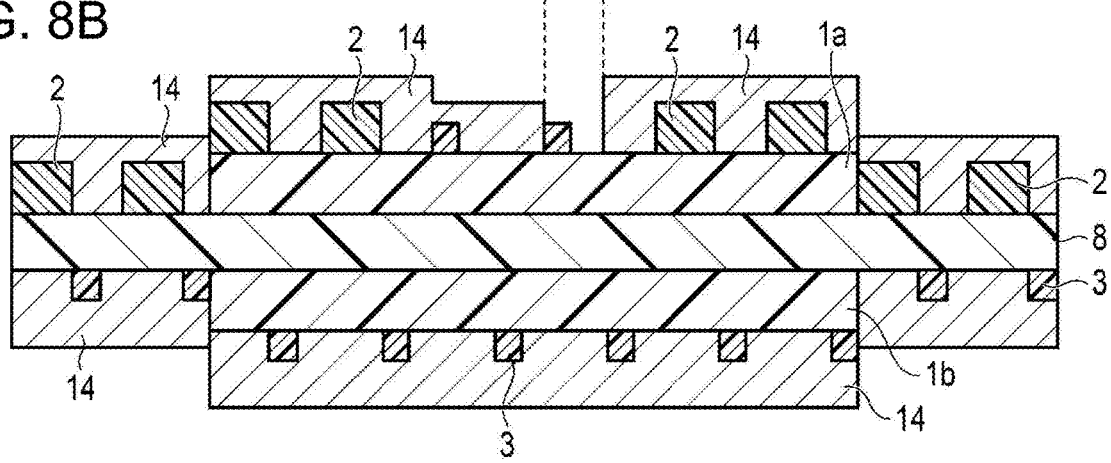
Figure 8C:
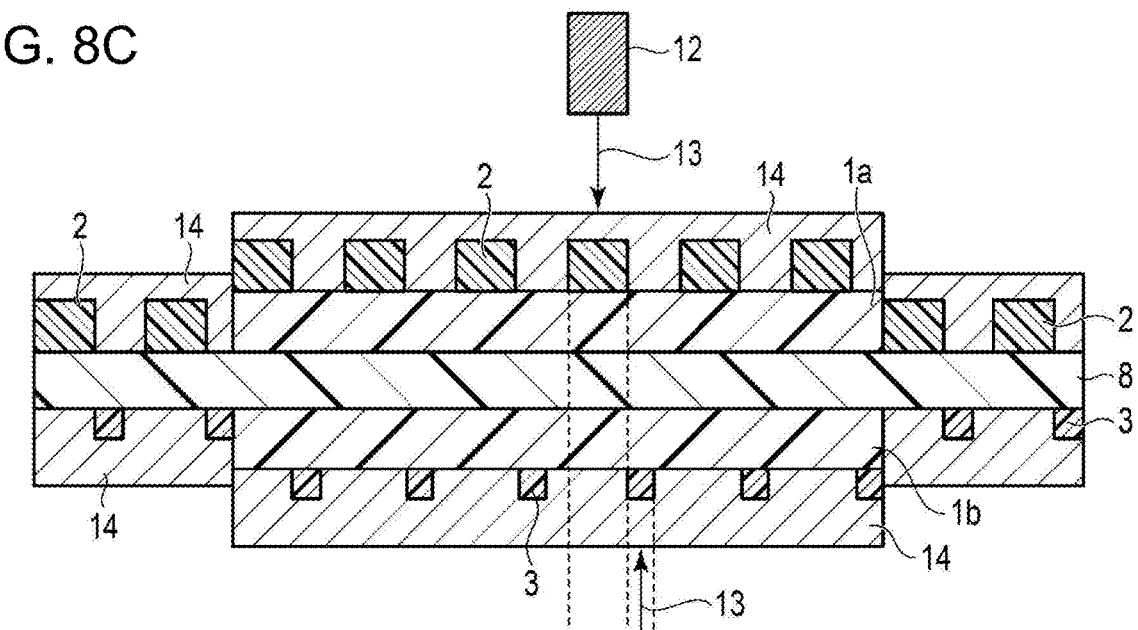
FIGS. 8C and 8D are a set of diagrams illustrating a method of forming a three-dimensional structure of a three-dimensional display.
Figure 8D:
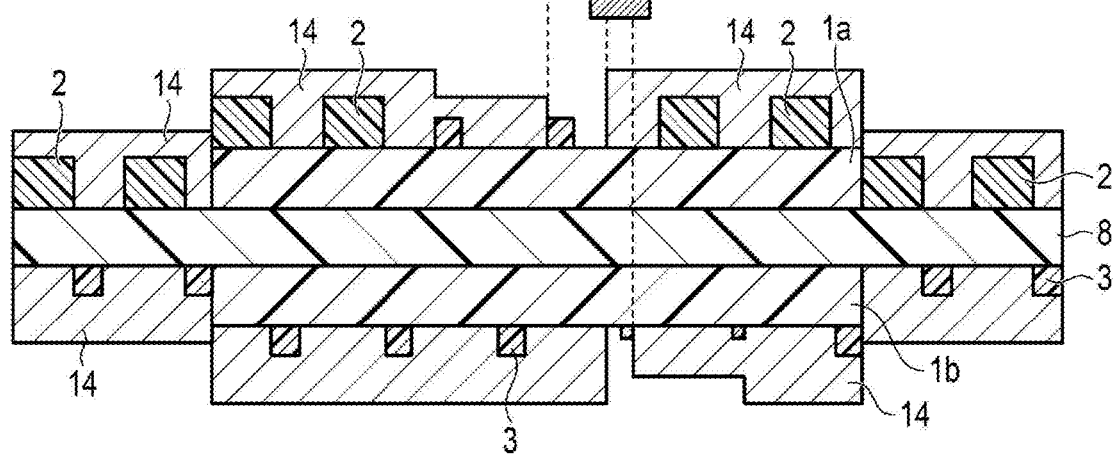

As shown in FIGS. 6A, 8A and 8C, low intensity laser light 13*b* may be applied to one side or both sides from a laser irradiation device 12*b*. Thus, as shown in FIGS. 6B, 8B and 8D, only the single- or multi-layer reflective layer 14 can be entirely or partly removed by forming it with a material having a different wavelength absorption, leaving the first element cells 2 and/or the second element cells 3.

The material having a different wavelength absorption may be a metal compound. The metal compound may be zinc sulfide, alumina, or titanium oxide. These metal compounds are less likely to be chemically altered and can retain the reconstructed images stored in the storage regions for a long time.

Thus, the effects of the reflective layer 14 can be reduced. The first and second element cells 2 and 3 forming the three-dimensional structures may be formed of resins that can be deformed by a laser, so that the shapes of the reconstructed images can be changed as desired or the effects of the reconstructed images can be reduced or increased.

Demetallization using a laser can thus form a transparent window portion 23, and by transferring three-dimensional hologram foils to the front and rear sides of the window portion, cards which are resistant to counterfeiting can be produced. An example in which this is applied to a passport will be described.

Figure 9:
FIG. 9 is diagram illustrating an example of a passport formed by transferring three-dimensional holograms to the front and rear sides of a transparent window portion.

FIG. 9 is a diagram illustrating an example of a passport formed by transferring three-dimensional hologram foils to the front and rear sides of transparent window portions.

In this passport 40, three-dimensional hologram foils are transferred to the front and rear sides of the transparent window portions, which correspond to the transparent window portion 23 shown in FIG. 7B, to form a first facial image 41 and a second facial image 42.

In this passport 40, even if the first facial image 41 is tampered with, the tempering can be detected from discrepancies with the second facial image 42 formed in the transparent window portion. Also, counterfeit products can be visually detected from the deviation between the three-dimensional patterns on the front and rear sides.

The following description relates to a method of recording the phases calculated using a CGH technique in the phase angle recording region of the first region 5, the first contour region 9, the second region 6, or the second contour region 10.

Figure 10:
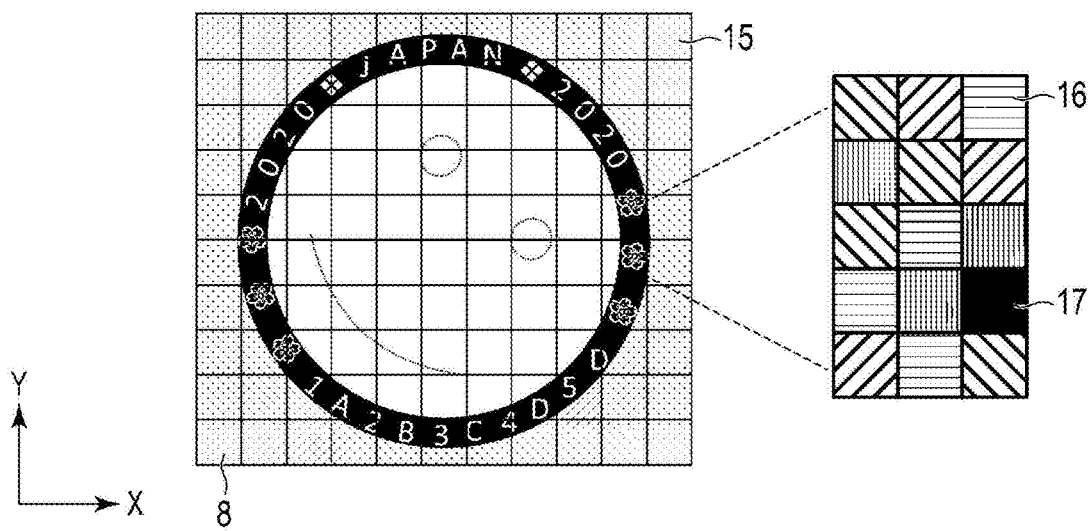
FIG. 10 is a set of diagrams illustrating a phase angle recording region for recording phases calculated using a CGH technique.

FIG. 10 is a diagram illustrating a phase angle recording region for recording phases calculated using a CGH technique.

The three-dimensional display 4 has a recording surface on the laminate sheet 8. The recording surface is provided with pixels which are grouped, as described in PTL 7, into calculated element sections 15, a phase angle recording region 16, and a phase angle non-recording region 17.

The positional relationship between the calculated element sections 15, phase angle recording region 16, and phase angle non-recording region 17 will be described using an XYZ Cartesian coordinate system.

When light enters the pixel plane in a direction intersecting the pixel plane, the incident light is modulated by the pixel plane so that a reconstructed image can be obtained. The reconstructed image is formed of a plurality of reconstruction points. The reconstruction points are at positions apparently separated from the pixel plane in the Z direction preferably by 5 mm or more and 25 mm or less.

When the pixel plane is viewed from a reconstruction point of interest, the angular range in which the reconstructed image is produced in the viewing angle direction is referred to as a viewing angle $\theta$. In the following description, the viewing angle direction is the X direction or the Y direction. The viewing angle $\theta$ from the reconstruction point is defined by the following Formula (1).

$$\theta < (A/m) \tag{1}$$

If $(\lambda/2d) \le 1$ is satisfied, the following Formula (2) is obtained.

$$A = a\sin(\lambda/2d) \tag{2}$$

where $\lambda$ is a wavelength of light, d is an arrangement interval of unit blocks in the viewing angle direction, and m is a real number greater than or equal to 3.

The wavelength $\lambda$ of light may be specifically 555 nm, which corresponds to the maximum human visual sensitivity to visible light. The arrangement interval d may be the distance between the centers of the unit blocks. The arrangement interval d of the unit blocks may be 10 nm or more and 200 nm or less.

The viewing angle $\theta$, which is determined by the range in the X direction when the pixel plane is viewed from the reconstruction point of interest, is ½ of the angle $2\theta$ formed by a minimum value Xmin in the X direction, the reconstruction point of interest, and a maximum value Xmax in the X direction. The X direction and the Y direction respectively correspond to the X and Y coordinate axes of Euclidean coordinates where one direction in which the pixel plane extends is defined to be an X direction and the direction orthogonal to the X direction is defined to be a Y direction.

The viewing angle $\theta$ when the viewing angle direction is the Y direction is similarly defined. Specifically, the viewing angle $\theta$, which is determined by the range in the Y direction when the relief surface is viewed from the reconstruction point of interest, is ½ of the angle $2\theta$ formed by a minimum value Ymin in the Y direction, the reconstruction point of interest, and a maximum value Ymax in the Y direction. Accordingly, the arrangement interval d between the unit blocks corresponds to an arrangement interval dx between the unit blocks in the X direction when the viewing angle direction is the X direction and corresponds to an arrangement interval dy between the first element cells 2 and second element cells 3 in the Y direction when the viewing angle direction is the Y direction.

Accordingly, the calculated element sections 15 each generally have a square or rectangular shape. However, the calculated element sections 15 may have a polygonal shape other than quadrangle or may have a circular or elliptical shape. In addition to squares and rectangles, hexagons in particular can be appropriately used as the polygonal shape. If the calculated element sections 15 have a shape other than a square or rectangular shape, the minimum value (lower limit) in the X direction of the calculated element section 15 may be defined by Xmin, and the maximum value (upper limit) in the X direction of the calculated element section 15 may be defined by Xmax. Similarly, the minimum value in the Y direction of the calculated element section 15 may be defined by Ymin, and the maximum value in the Y direction of the calculated element section 15 may be defined by Ymax.

If each unit block has a square or rectangular shape, the square or rectangle may actually have rounded corners. Each unit block may be merged with the adjacent unit blocks. In this case, even when each unit block has a rounded square shape, the merged unit blocks do not necessarily have a rounded square shape but may have a deformed shape; however, even when the shape is changed by the merge, the optical effects may remain unchanged. The unit blocks are preferably arranged in an orderly manner. The orderly arrangement may be an arrangement in which the unit blocks are arranged at intervals within a predetermined range or an arrangement in which they are arranged at regular intervals. A typical orderly arrangement may be a square or hexagonal arrangement.

As is clear from Formula (1), the viewing angle $\theta$ is less than A. If light passes through this phase component and is diffracted, theoretically no diffraction beyond A may occur. Accordingly, if computational hologram calculation is performed, the calculation range may be limited to the viewing angle $\theta$ as an upper limit. By limiting the calculation range, the calculation time can be shortened. If the calculation is performed for the range beyond the viewing angle $\theta$, the calculation may only be performed for diffraction that does not theoretically exist, and therefore, the results may only contribute as noise. In this regard, since the above calculation is not performed for the range beyond the viewing angle $\theta$, noise will not be superimposed on the reconstruction points when producing a reconstructed image thereon.

The phase angle recording region 16 and the phase angle non-recording region contain a plurality of unit blocks. In the phase angle recording region 16, the unit blocks included in an overlapping region where they overlap with the calculated element sections 15 are targeted for computational phase angle calculation based on the phase components, and the calculated phase angles are recorded in the respective unit blocks included in the overlapping region.

The calculated element sections 15 are defined in this way on the pixel plane according to the viewing angles $\theta$. Thus, the calculated element sections 15, which are defined independent of the phase angle recording region 16 and the phase angle non-recording region 17, usually overlap individually with the phase angle recording region 16 and phase angle non-recording region 17.

The calculated element sections 15 correspond one-to-one to the reconstruction points of the reconstructed image, and the phase component of light from each of the reconstruction points is calculated. Since there are multiple reconstruction points, there also are multiple calculated element sections 15 whose number is the same as that of the reconstruction points, and the phase component of light from each of the reconstruction points is calculated for the corresponding one of the multiple calculated element sections 15.

The phase angle recording region 16 is a region in which the phase angles calculated based on the phase components can be recorded.

The phase angle non-recording region 17 is a region in which the phase angles are not recorded and is a mirror surface according to an example.

The phase angles are recorded in the overlapping region, where the calculated element sections 15 overlap with the phase angle recording region 16, for the respective calculated element sections 15 therein.

The phase angle non-recording region 17 can record therein information other than the phase angles, such as properties of light scattering, reflection, and diffraction.

Figure 11A:
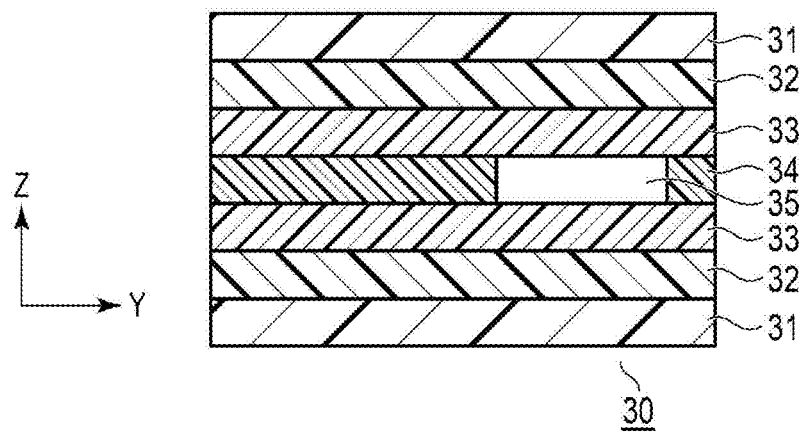
Figure 11B:
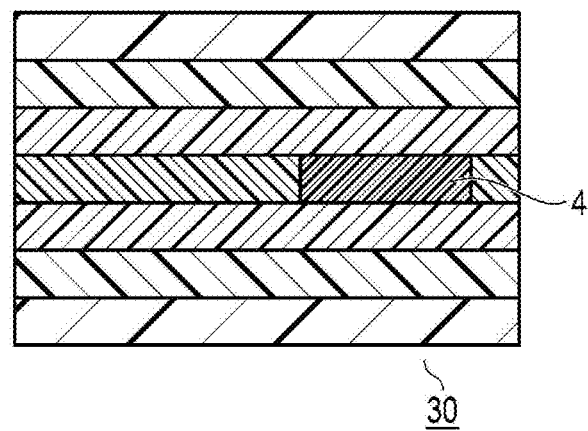

FIGS. 11A and 11B are a set of diagrams in which FIG. 11A is a cross-sectional view illustrating a laminate 30 before embedding the three-dimensional display 4 and FIG. 11B is a cross-sectional view illustrating the laminate 30 after embedding the three-dimensional display 4. The overall thickness may be in the range of 0.18 mm or more and 0.84 mm or less according, for example, to JIS X6311 and JIS X6301 (ISO/IEC7810).

The laminate 30 is formed by sequentially laminating, from the upper side in the figure, a transparent protective layer 31 that is a transparent outer layer substrate, a phase modulation layer 32 that receives and modulates illumination light, an imprinted layer 33 that is a transparent intermediate substrate developing colors when exposed to laser light, a core layer 34 that is a core substrate, an imprinted layer 33, a phase modulation layer 32, and a transparent protective layer 31. The first region 5 and the second region 6 of the three-dimensional display 4 are visible from outside the laminate 30.

A laminate 30 in which a three-dimensional display 4 is embedded can be provided, as shown in FIG. 11B, by embedding the three-dimensional display 4 in an embedding portion 35 which is a transparent non-printed portion as a part of the core layer 34.

The three-dimensional display 4 can also be formed on a carrier, not shown. In this case, the three-dimensional display 4 on the carrier, not shown, can be attached to an adherend, not shown, by hot-stamping it via an adhesion region 18 shown in FIGS. 1F and 2G.

Figure 1F:
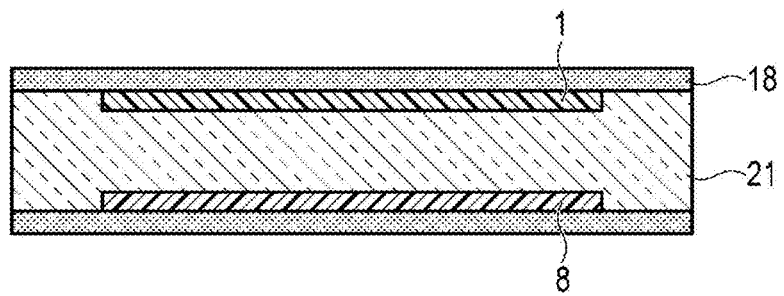
FIG. 1F is a cross-sectional view illustrating an example of a positional relationship between a laminate sheet and an adhesion region.
Figure 2G:
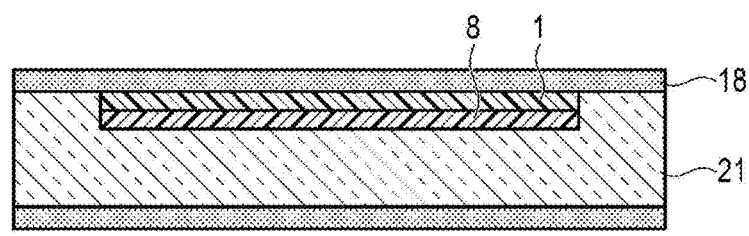
FIG. 2G is a cross-sectional view illustrating another example of a positional relationship between a laminate sheet and an adhesion region.

FIGS. 1F and 2G are cross-sectional views each illustrating an example of a positional relationship between laminate sheets and the adhesion region.

The laminate sheet on which the three-dimensional display 4 is arranged can be attached, for example, to an adherend, e.g., printed notes, printed pages, and printed cards, via the adhesion region 18 shown in FIGS. 1F and 2G. The adhesion region 18 can also be attached to an adherend by hot stamping. Thus, by attaching the three-dimensional display 4 to an adherend, an authentication medium 100 provided with a three-dimensional display 4 can be obtained.

An example of the authentication medium 100 is a card. The card can be an ID card, license card, or game card. The ID card can be a national ID card, foreigner residence card, or tax payment card. A booklet can be a passport.

The carrier, not shown, may be a plastic film. The plastic film may be made of PET (polyethylene terephthalate), PEN (polyethylene naphthalate), or PP (polypropylene). The plastic film may include a coating layer formed by applying a resin.

Referring back to FIGS. 11A and 11B, the phase modulation layers 32 may be multilayers. Each phase modulation layer 32 may have a configuration in which an embossing layer, a reflective layer, and a mask layer are sequentially laminated. The reflective layer and the mask layer may be omitted. The material of the transparent protective layers 31 may be a thermoplastic polymer. The material of the embossing layer may be a curable polymer. The material of the reflective layer may be an inorganic material. The transparent protective layer 31 and the embossing layer can be formed by coating. The reflective layer can be formed into a single- or multi-layer by deposition. The deposition may be physical deposition or chemical deposition. The physical deposition may be vacuum vapor deposition or sputtering. The mask layer can be formed by printing an ink. The printing may be offset printing, gravure printing, or screen printing. The ink may be an oil-based ink or water-based ink. The ink may be a UV ink.

The embossing layer may be a single layer or a composite layer. The composite layer may be configured by a relief layer, an intermediate part, and an anchor layer. The relief layer may be made of a curable polymer. The anchor layer may be made of a thermosetting polymer. The intermediate layer may be a mixture.

The transparent protective layer 31 may be made of a material that is a mixture of a resin and a lubricant. The resin may be a thermoplastic resin. Examples of the resin include acrylic resins, polyester resins, polyamide resins, and cellulose resins. The lubricant may be a wax such as polyethylene powder, paraffin wax, silicone wax, carnauba wax, or the like. These may be applied to a substrate layer using a known coating method such as a gravure printing method or microgravure method to provide a release layer. The release layer may have a thickness in the range of 0.5 μm or more and 5 μm or less.

The material of the embossing layer may be polyacrylate, polyurethane acrylate, or polyacrylic acrylate. The material of the relief layer may be polyacrylate, polyurethane acrylate, or polyacrylic acrylate. The material of the intermediate part may be a mixture of polyacrylate and polyurethane acrylate. The material of the anchor layer may be polyurethane acrylate.

The transparent protective layer 31, the phase modulation layer 32, the imprinted layer 33, and the core layer 34 in which the three-dimensional display 4 is embedded in the embedding portion 35 are laminated in this order by applying heat and pressure, and the laminate is integrated by thermocompression bonding to form a laminate 30 as shown in FIG. 11B. The laminate 30 can be used for cards, tags, or booklet pages. Thus, an authentication medium with a security label can be formed.

As an additional element, a reflective scattering layer, not shown, may be provided. For the reflective scattering layer, functional inks whose colors change according to the illumination angles or the observation angles may be used. As such functional inks, optically variable inks, color shift inks, or pearl inks, for example, can be used.

The following description relates to recording using the arrangement of the first region 5, first contour region 9, second region 6, and second contour region 10.

The first region 5 can record personal identification data including biometric information. For example, the face of the ID card holder can be produced as a color image expressed by two or more colors, i.e., can be produced as a first reconstructed image 7a by allowing the individual calculated element sections 15 to have gradation values of the respective colors.

The second region 6 can record different data of the personal identification data including the biometric information recorded in the first region 5. For example, hash information or the like related to the ID card holder stored in the first region 5 can be produced as a second reconstructed image 7b by allowing the individual calculated element sections 15 to have gradation values binarized based on the first region 5.

As data of the color image expressed by two or more colors, the first contour region 9 has gradation values of the respective colors for each of the calculated element sections 15. The second contour region 10 has gradation values binarized based on the first contour region 9 for each of the calculated element sections 15.

Thus, the first and second contour regions 9 and 10 can record characters of personal identification information including the biometric information related to the first and second regions 5 and 6. For example, the hash information or the like related to the ID card holder recorded in the first and second regions 5 and 6 can be produced as a reconstructed image 11a derived from the first contour region and a reconstructed image 11b derived from the second contour region, by which aesthetic effects can be enhanced.

The first and second contour regions 9 and 10 can be used for preventing counterfeiting of the first and second regions 5 and 6. For example, the first region 5 may be combined with the first contour region 9 and the element cells on these regions may be arranged overlapping the two regions, so that a counterfeit product made by peeling off the original product can produce a reconstructed image from which a counterfeiting can be detected.

Next, referring to FIGS. 11A and 11B again, detailed production of a card according to an embodiment of the present invention will be described in the following examples.

Example 1

A transparent polycarbonate resin sheet (thickness: 100 µm) was used as a material for the transparent protective layer 31, a transparent polycarbonate resin sheet including a phase shift structure (thickness: 100 µm) was used as a material for the phase modulation layer 32, a laser coloring polycarbonate resin sheet (thickness: 100 µm) was used as a material for the imprinted layer 33, and a white polycarbonate resin sheet (thickness: 200 µm) was used as a material for the core layer 34.

Next, a three-dimensional display 4 formed on a laminate sheet was partly hot-stamped and attached to the imprinted layer 33 and, after that, the transparent protective layer 31, the phase modulation layer 32, the imprinted layer 33, and the core layer 34 in which the three-dimensional display 4 was arranged in the embedding portion 35 thereof were laminated together in this order, followed by heating and pressing with a 180-degree plate and further followed by cooling. After that, the laminate was punched into a shape of 85 mm×54 mm to obtain a card.

The three-dimensional display 4 having phase structures was formed by interleaving a plurality of first element cells 2 for producing a reconstructed image 7a as a group of multiple reconstruction points showing a facial motif on the front side of the three-dimensional display 4 at a reconstruction distance of $Z1=2$ mm from the front surface, with a plurality of second element cells 3 for producing a reconstructed image 7b as a group of multiple reconstruction points showing a motif of the sun on the rear side of the three-dimensional display 4 at a reconstruction distance of $Z2=2$ mm from the rear surface, in the first region 5 and the second region 6.

When the card to which the three-dimensional display 4 is attached is observed under a point light source, the observer can feel a sense of depth from the reconstructed image of the facial motif and the reconstructed image of the motif of the sun which appear distanced from each other by 4 mm. Under ambient lighting of a surface light source or indirect lighting, only the reconstructed image 7a of the face produced at a distance of 2 mm from the front surface was visible on the front side of the three-dimensional display 4; however, under lighting of a point light source, the reconstructed image 7b of the sun produced at a distance of 2 mm from the rear surface was visible on the front side of the three-dimensional display 4.

Preparation of Electroformed Plate

A resist plate on a surface of which a relief structure was formed as asperities by electron-beam lithography was formed as a master plate, an electrically conductive film was deposited on the surface of the master plate, and a shim duplicating the relief structure was prepared by electroforming.

Preparation of Transfer Foil

For the three-dimensional display 4, a peelable transparent protective layer 31 was formed on a PET film carrier by coating, and an embossing layer was formed by applying a precursor to the transparent protective layer 31 with a dry thickness of 3 µm. Then, while being heated and UV-irradiated, the shim having electroformed asperities on the surface thereof was pressed against the surface of the embossing layer for embossment, thereby forming asperities as a relief structure on the embossing layer. After that, an aluminum reflective layer was formed by vacuum vapor deposition on the surface of the embossing layer on which the relief structure was formed. Furthermore, an adhesive was applied to the reflective layer to form an adhesive layer. These materials used for coating may be diluted with a solvent.

As can be seen from the above example, it was confirmed that a laminate 30 embedding the three-dimensional layer 4 according to the embodiment of the present invention could be satisfactorily prepared.

While the best mode for carrying out the present invention has been described with reference to the accompanying drawings, the present invention is not limited to such a configuration. It is understood that various changes and modifications can be made by those skilled in the art within the scope of the technical idea of the invention recited in the claims, and these changes and modifications should also reside in the technical scope of the present invention.

REFERENCE SIGNS LIST

1 . . . Laminate sheet; 2 . . . First element cells; 3 . . . Second element cells; 4 . . . Three-dimensional display; 5 . . . First region; 6 . . . Second region; 7a . . . First reconstructed image; 7b . . . Second reconstructed image; 8 . . . Laminate sheet; 9 . . . First contour region; 10 . . . Second contour region; 11a . . . Reconstructed image derived from first contour region; 11b . . . Reconstructed image derived from second contour region; 12 . . . Laser irradiation device; 13a . . . High intensity laser light; 13b . . . Low intensity laser light; 14 . . . Reflective layer; 15 . . . Calculated element section; 16 . . . Phase angle recording region; 17 . . . Phase angle non-recording region; 18 . . . Adhesive region; 19 . . . Marker; 20 . . . Contour portion; 21 . . . Front side hologram foil; 22 . . . Rear side hologram foil; 23 . . . Transparent window portion; 25 . . . Embedding portion; 30 . . . Laminate; 31 . . . Transparent protective layer; 32 . . . Phase modulation layer; 33 . . . Imprinted layer; 34 . . . Core layer; 35 . . . Embedding portion; 40 . . . Passport; 41 . . . First facial image; 42 . . . Second facial image; 100 . . . Authentication medium.

What is claimed is:

1. A three-dimensional display formed by arranging first element cells in which personal identification information is recorded, and second element cells carrying an authentication medium through which the personal identification information is visible, on a laminate sheet, wherein
    the display includes a first region and a second region formed by arranging a plurality of the first element cells and a plurality of the second element cells;
    wherein: the first element cells and the second element cells respectively form phase shift structures;
    in the first region and in the second region, respective three-dimensional structures are formed with spacers interposed between the first element cells and the second element cells;
    the first region and the second region residing in the three-dimensional structures form coherent and unified three-dimensional images with groups of reconstruction points produced by reflected light from the phase shift structures;
    a first reconstructed image is produced on a first side of the laminate sheet, at a position apparently separated from the laminate sheet, due to the phase shift structure formed by the first element cells; and
    a second reconstructed image is produced on a second side of the laminate sheet, at a position apparently separated from the laminate sheet, due to the phase shift structure formed by the second element cells.

2. A three-dimensional display, wherein the three-dimensional display is configured by combining (a) a first three-dimensional display, which is the three-dimensional display of claim 1 and (b) a second three-dimensional display, which is a three-dimensional display in which a first contour region surrounding a recorded first character, and a second contour region surrounding a recorded second character are arranged on a laminate sheet, wherein
    a plurality of first element cells in which personal identification information is recorded and a plurality of second element cells carrying an authentication medium through which the personal identification information is visible are arranged in the first contour region and in the second contour region to form respective phase shift structures;
    wherein: in the first contour region and in the second contour region, the first element cells and the second element cells are arranged in an interleaved manner at a predetermined ratio to form respective three-dimensional structures;
    the first contour region and the second contour region are visible respectively from first and second sides of the laminate sheet;
    a reconstructed image derived from the second contour region is produced on the first side of the laminate sheet, at a position apparently separated from the laminate sheet, due to the phase shift structure formed by the first element cells; and
    a reconstructed image derived from the first contour region is produced on the second side of the laminate sheet, at a position apparently separated from the laminate sheet, due to the phase shift structure formed by the second element cells.

3. The three-dimensional display of claim 2, wherein
    a first marker is provided to the laminate sheet on which the first three-dimensional display is arranged;
    a second marker is provided to the laminate sheet on which the second three-dimensional display is arranged, wherein
    a plurality of first element cells in which personal identification information is recorded and a plurality of second element cells carrying an authentication medium through which the personal identification information is visible are arranged in the first contour region and in the second contour region to form respective phase shift structures;
    in the first contour region and in the second contour region, the first element cells and the second element cells are arranged in an interleaved manner at a predetermined ratio to form respective three-dimensional structures;
    the first contour region and the second contour region are visible respectively from first and second sides of the laminate sheet;
    a reconstructed image derived from the second contour region is produced on the first side of the laminate sheet, at a position apparently separated from the laminate sheet, due to the phase shift structure formed by the first element cells; and
    a reconstructed image derived from the first contour region is produced on the second side of the laminate sheet, at a position apparently separated from the laminate sheet, due to the phase shift structure formed by the second element cells
    is arranged; and
    the first three-dimensional display and the second three-dimensional display
    are combined with each other by bringing the two laminate sheets into alignment using the first marker and the second marker.

4. The three-dimensional display of claim 3, wherein the first three-dimensional display and the second three-dimensional display
    are overlapped and combined with each other.

5. The three-dimensional display of claim 1, wherein a relation $Z1<Z2$ is established between a first distance $Z1$ that is a distance from the first side to the first reconstructed image and a second distance $Z2$ that is a distance from the second side to the second reconstructed image.

6. The three-dimensional display of claim 1, wherein a relation $Z1>Z2$ is established between a first distance $Z1$ that is a distance from the first side to the first reconstructed image and a second distance $Z2$ that is a distance from the second side to the second reconstructed image.

7. The three-dimensional display of claim 1, wherein
    the laminate sheet includes a recording surface, the recording surface including, calculated element sections corresponding one-to-one to reconstruction points of the first reconstructed image and the second reconstructed image, and subjected to phase component calculation for light from the individual reconstruction points,
a phase angle recording region in which phase angles calculated based on the phase components can be recorded, and
a phase angle non-recording region in which the phase angles are not recorded; and
the phase angles are recorded in an overlapping region where the calculated element sections overlap with the phase angle recording region.

8. The three-dimensional display of claim 7, wherein
a plurality of the calculated element sections are provided;
a phase component of light from each of the reconstruction points is calculated for a corresponding one of the plurality of calculated element sections; and
the calculated phase angle is recorded in the corresponding one of the calculated element sections.

9. The three-dimensional display of claim 7, wherein information other than the phase angles is recorded in the phase angle non-recording region.

10. The three-dimensional display of claim 9, wherein
the information other than the phase angles is information including at least one of light scattering, light reflection, and light diffraction.

11. The three-dimensional display of claim 7, wherein
the first region includes gradation values as data of a color image expressed by two or more colors, for each of the calculated element sections in terms of the individual colors; and
the second region includes gradation values binarized based on the first region, for each of the calculated element sections.

12. An authentication medium including a laminate in which a transparent outer layer substrate, a phase shift substrate for receiving and modulating illumination light, a transparent intermediate substrate developing colors when exposed to laser light, and a core substrate are laminated, wherein
at least a part of the core substrate includes a transparent non-printed portion; and
the three-dimensional display of claim 1 is embedded in the laminate.

13. The authentication medium of claim 12, wherein the first region and the second region of the three-dimensional display are visible from outside the laminate.

14. A method of forming the three-dimensional structure in the three-dimensional display of claim 1, wherein
the first element cells and the second element cells are processed by externally applying laser light to the three-dimensional display to form the three-dimensional structure.

15. A three-dimensional display in which a first contour region surrounding a recorded first character, and a second contour region surrounding a recorded second character are arranged on a laminate sheet, wherein
a plurality of first element cells in which personal identification information is recorded and a plurality of second element cells carrying an authentication medium through which the personal identification information is visible are arranged in the first contour region and in the second contour region to form respective phase shift structures;
wherein: in the first contour region and in the second contour region, the first element cells and the second element cells are arranged in an interleaved manner at a predetermined ratio to form respective three-dimensional structures;
the first contour region and the second contour region are visible respectively from first and second sides of the laminate sheet;
a reconstructed image derived from the second contour region is produced on the first side of the laminate sheet, at a position apparently separated from the laminate sheet, due to the phase shift structure formed by the first element cells; and
a reconstructed image derived from the first contour region is produced on the second side of the laminate sheet, at a position apparently separated from the laminate sheet, due to the phase shift structure formed by the second element cells.

16. The three-dimensional display of claim 15, wherein a relation $Z4<Z3$ is established between a third distance $Z3$ that is a distance from the second side to the reconstructed image derived from the first contour region and a fourth distance $Z4$ that is a distance from the first side to the reconstructed image derived from the second contour region.

17. The three-dimensional display of claim 15, wherein a relation $Z4>Z3$ is established between a third distance $Z3$ that is a distance from the second side to the reconstructed image derived from the first contour region and a fourth distance $Z4$ that is a distance from the first side to the reconstructed image derived from the second contour region.

18. The three-dimensional display of claim 15, wherein
the laminate sheet includes a recording surface, the recording surface including,
calculated element sections corresponding one-to-one to reconstruction points of the reconstructed image derived from the first contour region and the reconstructed image derived from the second contour region, and subjected to phase component calculation for light from the individual reconstruction points,
a phase angle recording region in which phase angles calculated based on the phase components can be recorded, and
a phase angle non-recording region in which the phase angles are not recorded; and
the phase angles are recorded in an overlapping region where the calculated element sections overlap with the phase angle recording region.

19. The three-dimensional display of claim 18, wherein
the first contour region includes gradation values as data of a color image expressed by two or more colors, for each of the calculated element sections in terms of the individual colors; and
the second contour region includes gradation values binarized based on the first contour region, for each of the calculated element sections.

* * * * *